US012283918B2

(12) United States Patent
Kosharovsky et al.

(10) Patent No.: US 12,283,918 B2
(45) Date of Patent: *Apr. 22, 2025

(54) PHOTOVOLTAIC SYSTEM FAILURE AND ALERTING

(71) Applicant: Solaredge Technologies Ltd., Herzeliya (IL)

(72) Inventors: Yury Kosharovsky, Givat Ze'ev (IL); Sharon Haver, Ramat HaSharon (IL); Yaron Binder, Shoham (IL); Lior Handelsman, Givatayim (IL)

(73) Assignee: Solaredge Technologies Ltd., Herzeliya (IL)

(*) Notice: Subject to any disclaimer, the term of this patent is extended or adjusted under 35 U.S.C. 154(b) by 0 days.

This patent is subject to a terminal disclaimer.

(21) Appl. No.: 18/401,803

(22) Filed: Jan. 2, 2024

(65) Prior Publication Data

US 2024/0291429 A1    Aug. 29, 2024

Related U.S. Application Data

(63) Continuation of application No. 18/166,214, filed on Feb. 8, 2023, now Pat. No. 11,901,861, which is a
(Continued)

(51) Int. Cl.
*H02S 50/10*        (2014.01)
*G01R 19/165*     (2006.01)
(Continued)

(52) U.S. Cl.
CPC ........ *H02S 50/10* (2014.12); *G01R 19/16528* (2013.01); *G01R 19/16538* (2013.01);
(Continued)

(58) Field of Classification Search
CPC ... H02S 50/10; H02S 50/00; G01R 19/16528; G01R 19/16538; G06F 11/327; Y02E 10/50; Y04S 10/52; G05B 23/027
(Continued)

(56) References Cited

U.S. PATENT DOCUMENTS 5,502,812 A    3/1996  Leyre et al.
7,200,525 B1   4/2007  Williams et al.
(Continued)

FOREIGN PATENT DOCUMENTS

CN     1547306 A     11/2004
CN     102158129 A    8/2011
(Continued)

OTHER PUBLICATIONS

Feb. 21, 2020—Extended European Search Report—EP 19203891.7.
(Continued)

*Primary Examiner* — Raul J Rios Russo
(74) *Attorney, Agent, or Firm* — Banner & Witcoff, Ltd.

(57) ABSTRACT

A fault identification may be triggered by a component of a power generation system (PGS), such as a hardware component, a controller of a hardware component, a device of the PGS, a computer connected to the PGS, a computer configured to monitor the PGS, and/or the like. The fault identification may be the result of a failure of a component of the PGS, a future failure of a component of the PGS, a routine maintenance of the PGS, and/or the like. The fault is converted to a notification on a user interface using a mapping of faults, root-causes, notification rules, and/or the like. The conversion may use one or more lookup tables and/or formulas for determining the impact of the fault on the PGS, and/or the like.

20 Claims, 29 Drawing Sheets

Related U.S. Application Data continuation of application No. 17/824,036, filed on May 25, 2022, now Pat. No. 11,616,472, which is a continuation of application No. 16/655,648, filed on Oct. 17, 2019, now Pat. No. 11,387,778.

(60) Provisional application No. 62/746,698, filed on Oct. 17, 2018.

(51) Int. Cl.
  *G06F 11/32* (2006.01)
  *H02S 50/00* (2014.01)

(52) U.S. Cl.
  CPC ............ *G06F 11/327* (2013.01); *H02S 50/00* (2013.01); *Y02E 10/50* (2013.01); *Y04S 10/52* (2013.01)

(58) Field of Classification Search
  USPC ........................................................ 324/761
  See application file for complete search history.

(56) References Cited

U.S. PATENT DOCUMENTS

| | | | |
|---|---|---|---|
| 8,473,250 B2 | 6/2013 | Adest et al. | |
| 8,890,676 B1 | 11/2014 | Heath | |
| 9,026,260 B1 | 5/2015 | Thornley et al. | |
| 2006/0112061 A1* | 5/2006 | Masurkar | G06N 5/04 706/47 |
| 2010/0016997 A1 | 1/2010 | Ramsauer et al. | |
| 2011/0178977 A1 | 7/2011 | Drees | |
| 2012/0158205 A1 | 6/2012 | Hinman et al. | |
| 2012/0166363 A1 | 6/2012 | He et al. | |
| 2012/0223734 A1 | 9/2012 | Takada et al. | |
| 2012/0243745 A1 | 9/2012 | Amintafreshi | |
| 2012/0247542 A1 | 10/2012 | Ammer et al. | |
| 2012/0310427 A1* | 12/2012 | Williams | H02S 50/00 702/182 |
| 2012/0323507 A1 | 12/2012 | Hasegawa et al. | |
| 2013/0035883 A1* | 2/2013 | San Andres | H02J 13/00006 702/59 |
| 2014/0136178 A1 | 5/2014 | Meagher et al. | |
| 2014/0358827 A1 | 12/2014 | Motohashi et al. | |
| 2015/0094967 A1 | 4/2015 | Kouno et al. | |
| 2016/0091554 A1 | 3/2016 | Fornage et al. | |
| 2016/0203036 A1 | 7/2016 | Mezic et al. | |
| 2016/0245853 A1* | 8/2016 | Weiss | G01R 31/42 |
| 2018/0173216 A1 | 6/2018 | Spiro et al. | |
| 2018/0302030 A1 | 10/2018 | Friebe et al. | |
| 2019/0300030 A1* | 10/2019 | Heinrich | B61L 27/60 |
| 2020/0127604 A1 | 4/2020 | Kosharovsky et al. | |
| 2020/0382056 A1 | 12/2020 | Asanuma et al. | |
| 2021/0216065 A1 | 7/2021 | Spiro et al. | |

FOREIGN PATENT DOCUMENTS

| | | | |
|---|---|---|---|
| CN | 102208028 A | 10/2011 | |
| CN | 102291052 A | 12/2011 | |
| CN | 102608512 A | 7/2012 | |
| CN | 103715983 A | 4/2014 | |
| CN | 104579166 A | 4/2015 | |
| CN | 108614934 A | 10/2018 | |
| JP | 2010123880 A | 6/2010 | |
| JP | 2012524392 A | 10/2012 | |
| KR | 100912892 B1 | 8/2009 | |
| KR | 20120138866 A | 12/2012 | |
| WO | 2008125915 A2 | 10/2008 | |
| WO | 2013035110 A2 | 3/2013 | |

OTHER PUBLICATIONS

Jul. 13, 2021—European Office Action—EP 19203891.7.
Arani, M. Sabbaghpur et al., "The Comprehensive Study of Electrical Faults in PV Arrays," Hindawi Publishing Corporation, Journal of Electrical and Computer Engineering, vol. 2016, Dec. 6, 2016.
Shrestha, Sanjay, "Determination of Dominant Failure Modes Using Combined Experimental and Statistical Methods and Selection of Best Method to Calculate Degradation Rates," Arizona State University, Oct. 2014.
Wikipedia, "Failure mode and effects analysis".
Zhao, Ye, "Fault Detection, Classification and Protection in Solar Photovoltaic Arrays," Northeastern University, Aug. 2015.
Francis, Royce A. et al., "Information-based reliability weighting for failure mode prioritization in photovoltaic (PV) module design," Probabilistic Safety Assessment and Management PSAM, Jun. 12, 2014, Honolulu, Hawaii.
Bressan, Michael et al., "A new method for fault detection and identification of shadows based on electrical signature of defects," HAL Open Science, Oct. 5, 2015.
Sheng, Wanixng et al., "Risk-based Security Assessment in Distribution Network with the Integration of Photovoltaic," MATEC Web of Conferences 55, 03009 (2016).
Cristaldi, Loredana et al., "A root cause analysis and a risk evaluation of PV balance of systems failures," Journal of the International Measurement Confederation, vol. 6, No. 4, Dec. 2017.
Badi, L. et al., "Unbalanced faults analysis in grid—Connected PV system," IEEE International Conference on Power and Energy 2014.
Aug. 21, 2024—European Search Report—EP. App. No. 24157419. 3.

* cited by examiner

Select Rule Type:

○ No data from site
○ No data from inverter
○ Power optimizer shutdown
○ Meter communication fault
○ Inverter in Standby mode
○ Inverter Energy Below Threshold
◉ String fault
○ Weaker panel
○ Panel Partial Shading
○ Inverter Fault
○ 3 Phase Inverter Fault
○ No data received from battery
○ Battery fault
○ HD Inverter Fault
○ Unit Inverter Fault
○ Unit Grid Fault
○ Inverter Status Notification
○ Grid Fault
○ 3 Phase Inverter Grid Fault
○ HD Grid Fault

FIG. 6

710 → ☐ Inverter RCD Test Fault (error code 28)
☐ Grid Over-current of DC Component (error code 36)
☐ Ground fault (RCD) (error code 37)
☐ Ground fault (RCD Step) (error code 38)
☐ Grid Synchronization Fault (error code 39)
☐ No country selected (error code 44)
☐ I-ACDC L1 (error code 57)
☐ TZ RCD (error code 99)
☐ TZ L1 (error code 100)
☐ Over Temperature (error code 117)
☐ Under Temperature (error code 118)
☐ iRCDMax (error code 127)
☐ VNN ERROR (error code 129)
☐ Broken or unconnected temperature sensor (error code 133)

FIG. 7B

720 →
- ☐ Isolation (error code 134)
- ☐ RCD Test (error code 137)
- ☐ Arc Detected (error code 141)
- ☐ Islanding - passive (error code 144)
- ☐ VDC max (error code 145)
- ☐ VDC min (error code 146)
- ☐ Arc fault detected (error code 151)
- ☐ Arc detector self-test failed (error code 152)
- ☐ HW error (error code 153)
- ☐ Controller 3 error (error code 158)
- ☐ Tz over current 1 (error code 163)
- ☐ Tz over voltage cap1 (error code 166)
- ☐ HW error (error code 170)
- ☐ Over voltage in DC input of the inverter (error code 171)

FIG. 7C

730 →
- ☐ Internal error (error code 181)
- ☐ Internal error (error code 182)
- ☐ Internal error (error code 183)
- ☐ Internal error (error code 184)
- ☐ Internal error (error code 185)
- ☐ Internal error (error code 186)
- ☐ Internal error (error code 188)
- ☐ Vfilter unbalanced (error code 189)
- ☐ Inverter reset after possible arc detection (error code 1500)

PHOTOVOLTAIC SYSTEM FAILURE AND ALERTING

CROSS-REFERENCE TO RELATED APPLICATIONS

This application is a continuation of U.S. application Ser. No. 18/166,214, filed Feb. 8, 2023, which is a continuation of U.S. application Ser. No. 17/824,036, filed May 25, 2022, which is a continuation of U.S. application Ser. No. 16/655,648, filed Oct. 17, 2019, now U.S. Pat. No. 11,387,778, which is a non-provisional of and claims priority to U.S. Provisional Patent Application No. 62/746,698, filed Oct. 17, 2018, which are hereby incorporated by reference in their entireties for all purposes.

BACKGROUND

Methods and apparatuses consistent with example embodiments of the present application relate to the field of power generation systems.

Photovoltaic (PV) systems may convert solar energy to electricity. Solar panel PV modules may be positioned to be oriented towards the sun, and may convert the solar energy to electrical power. Each PV module may be optionally connected to a converter that determines the power output from the respective PV module, such as using maximum power point tracking (MPPT) and/or the like. The converters may be connected electrically in series to produce a higher voltage. The converters may be electrically connected to the input of a power inverter. The converters may be connected in parallel to produce a higher current provided to the power inverter. The power inverter may feed the solar power to an electrical grid, household electric devices, a battery backup system, and/or the like. Besides the PV modules themselves, the other electrical components of the PV system may be called the balance of system (BOS).

The background is not intended to limit the disclosed aspects of features, and not intended as limiting the application to a particular field or problem.

SUMMARY

The following summary briefly describes certain features and is not intended to be an extensive overview or to identify key or critical elements.

Systems, apparatuses, and methods are described for a fault identification that may be triggered by a component of a power generation system (PGS), such as a hardware component, a controller of a hardware component, a computerized device of the PGS, a computer connected to the PGS, a computer configured to monitor the PGS, and/or the like. The fault identification may be the result of a failure of a component of the PGS, a future failure of a component of the PGS, a routine maintenance of the PGS, and/or the like. The fault is converted to a notification on a user interface using a mapping of faults, root-causes, notification rules, and/or the like. The conversion may use one or more lookup tables for determining the impact of the fault on the PGS, for determining the language/wording to use with the severity of the impact on the PGS, and/or the like. The conversion may use one or more formulas to calculate an impact value based on the fault identification, the mapping, a power loss caused by the fault, a time that the fault is active, and energy loss, a financial loss, and/or the like.

These and other features and advantages are described in greater detail in the Detailed Description below.

BRIEF DESCRIPTION OF THE DRAWINGS

These and other features, aspects, and advantages of the present disclosure may become better understood with regard to the following description, claims, and drawings. The present disclosure is illustrated by way of example, and not limited by, the accompanying figures.

FIG. 3 shows an example screenshot of rule definition in a PV system fault presentation.

FIG. 6 shows an example screenshot of rules in a PV system fault presentation.

FIG. 7B shows a second example screenshot of fault types in a PV system fault presentation.

FIG. 7C shows a third example screenshot of fault types in a PV system fault presentation.

FIG. 7D shows a fourth example screenshot of fault types in a PV system fault presentation.

FIG. 8 shows an example screenshot of alerts in a PV system fault presentation.

FIG. 9 shows an example screenshot of accounts in a PV system fault presentation.

FIG. 10 shows an example screenshot of account column selection in a PV system fault presentation.

FIG. 11 shows an example screenshot of account details in a PV system fault presentation.

FIG. 13 shows an example screenshot of alert groups categories in a PV system fault presentation.

FIG. 14 shows an example screenshot of individual alerts in a PV system fault presentation.

FIG. 15 shows an example screenshot of second individual alerts in a PV system fault presentation.

FIG. 17 shows an example screenshot of alert by cause grouping in a PV system fault presentation.

FIG. 18 shows an example screenshot of alert by cause groups in a PV system fault presentation.

FIG. 19 shows an example screenshot of alert group details in a PV system fault presentation.

FIG. 20 shows an example screenshot of alert profiles in a PV system fault presentation.

DETAILED DESCRIPTION

Figure 1:
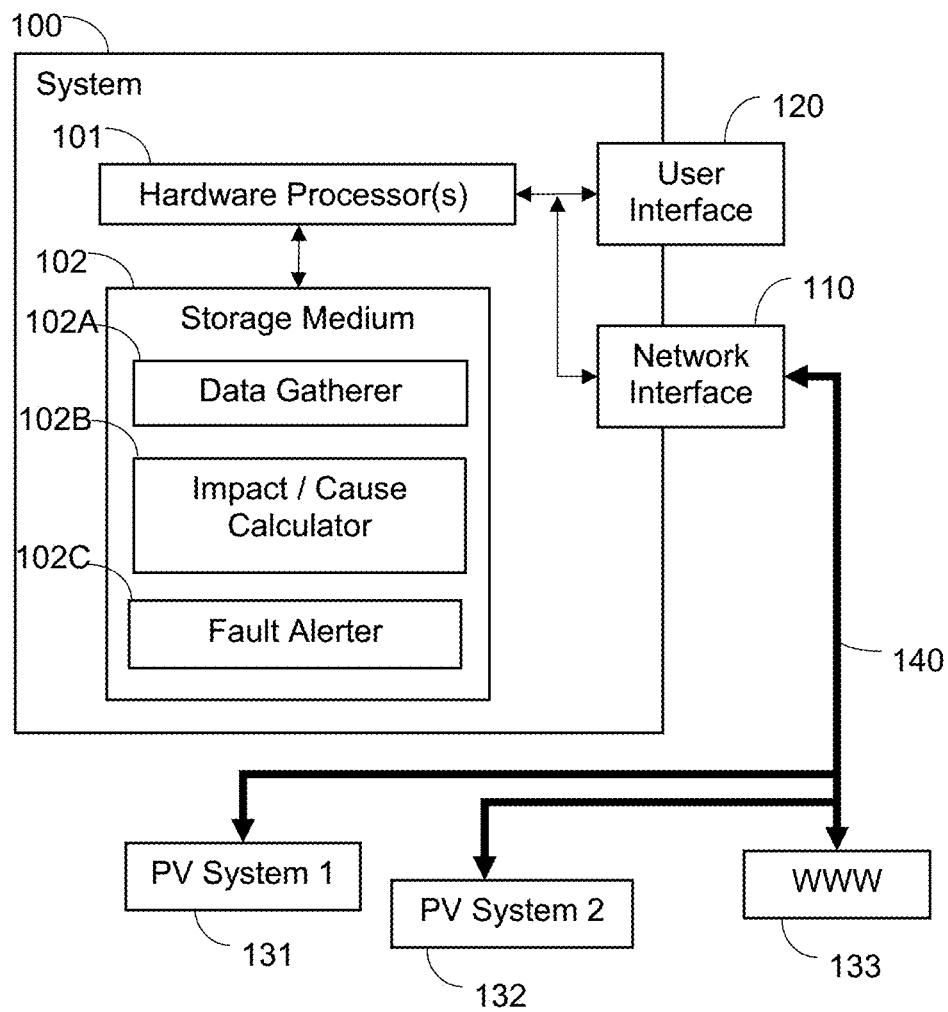
FIG. 1 shows schematically an example system for fault notification in photovoltaic (PV) systems.

Disclosed herein are aspects of features for devices, methods, and systems for solar-production rule dependencies mapping techniques and data structures. The technique and data structures may map the interconnection between possible faults, installations, configurations, and/or the like. The mapping may be used to determine an impact value of a first fault on system performance parameters, fault dependencies (such as the effect of a first fault on a performance parameter resulting from a second fault and/or the like), multiple interdependencies between two or more faults (such as multiple fault interactions), fault dependencies on external factors (e.g., weather, etc.), correlation between faults across geographical regions, fault priorities, or fault presentation techniques.

During installation and servicing of the PV system, situations may present themselves where the PV system is not operating at the full power generation potential of the system. In these cases, fault analysis systems may record and monitor the situations. Solar power energy-loss and system faults may be caused by a variety of factors, such as:

Panel shading, at least partially, such as from dust, vegetation, snow, soil, etc.;
Component/device degradation or failure, such as a burnt bypass diode, an aging MOSFET, a failed power supply/optimizer/converter/inverter, etc.;
Configuration/installation issues, such as wrong wiring, missing panels, planning error, etc.;
and/or the like.

Some faults may be identified and corrected individually, while other faults may be dependent on each other, such as in a hierarchy of faults, a time dependency of faults, a temporal relation between faults, a temporal frequency of faults, and/or the like. For example, in some cases one fault my hide another fault, or a first fault may not be detectable until a specific configuration/installation/second fault correction reveals the first fault. For example, a defective router may cause a report of no communication to an inverter, to one or more DC-DC converters, and/or the like, in addition to the faulty router. The same fault may cause a zero power production fault (because the power production value is not being communicated), but once the router is repaired the other faults may be moot. For example, some faults may be time dependent on other faults, such as when a first fault causes a slow/medium/fast degradation of a component, and when the component fails another fault is identified. The time dependency may be expressed as one or more rules, one or more formulas, and/or a combination of the like.

Furthermore, the features disclosed herein allow conversion of the technical element of a fault identification received from a component of a power generation system (PGS), to an actionable and/or meaningful notification to one or more users of the PGS, such as an end-user, an installer, a warranty provider, a service contractor, a technical supplier, a maintainer, a service technician, and/or the like. For example, aspects allow mitigating the notification for different types of service contracts. For example, when service contracts guarantee that faults are fixed within 2 hours, a fault may result in a notification with an "URGENT" indication to the service provider. For example, in regions, languages, or cultures where a notification of "MEDIUM" impact is semantically associated with non-urgency, a lookup table may set a rule to to change the "MEDIUM" word usage to "SEVERE," such as when the fault policy maps this change in word usage. For example, when a specific PGS has a 2-hour service contract, a zero-fault warranty agreement, and/or the like, the mapping of the notification may be to "URGENT" for all types of faults, thereby resulting in a higher response rate to the fault alerts. The aspects of the mappings, formulas, lookup tables, and/or the like, may be used to fine tune the notification system to the policy, mapping, culture, language, and/or the like of the particular installation. Furthermore, the collection of metadata, data from similar regions/systems/times, and/or the like, may allow the disclosed methods and systems to learn from the other data to assist in the notification and promote the resulting actions, such as using machine learning.

The aspect of features disclosed may provide the technical elements for adapting system and/or fault notifications to user needs, service contract details, installer policies, manufacturer warranty requirements, and/or the like. For example, the technical elements of a formula for computing an impact value may normalize the conversion of a power or energy loss across multiple systems of a service provide to prioritize the allocation of maintenance resources to the systems that are in most need of service.

Patterns of faults may be detected by comparison of multiple faults across systems that may have similar characteristics, such as similar components, similar weather patterns, similar geographical regions, similar service contracts, similar maintenance histories, and/or the like. For example, a manufacturer may determine that a component failure occurs in certain environments (such as, environments where temperatures are high or humidity is high), certain combinations of system components, and/or the like, and generate a fault identification to have the installer of similar systems provide a warranty replacement for prevention of a future failure.

A fault alert may be initiated for a maintenance event, such as a periodic maintenance event, a random maintenance event, a manufacturer recall event, a preventative maintenance event, a warranty event, and/or the like. The alert may be used by a manufacturer, service provider, warranty provider, and/or the like, where aspects of the disclosure may be used to set an impact value for each event according to criteria related to the event. For example, a maintenance alert may be to "update firmware", and an impact value may be calculated to be a value of 3. For example, in a PGS having optimizers (DC/DC converters configured to draw maximum power from corresponding power sources) a maintenance alert may be "Optimizers XYZ are being recalled", such as because the optimizers may damage the PGS, and an impact value of 7 may be calculated. For example, a faulty printed circuit board and/or component of an optimizer is detected by a manufacturer for a series of optimizers. Maintenance alerts may be sent out to the affected PGSs so the installers may replace these optimizers, which may each be in different locations of each string of each PGS, and/or the like. This feature may save effort by the installers in determining which optimizers may need replacing under the recall, and may prevent the actual failures before they occur.

An alert may be initiated by a service provider, installer, maintainer, and/or the like. For example, it may be snowing in an area and the service provider may trigger an alert in the area for "Snow". For example, a dust storm may be occurring in an area and a maintainer may trigger an event of a "Soiling". For example, an installer may be working on expanding a PGS and notice faulty isolation on an existing cable, and as a result the installer may initiate a fault sent to a maintainer for correction of the faulty isolation. As used herein the term alert may be used interchangeably with the term notification.

An impact value calculation may be used to provide a comparable value for alerts across multiple PGSs. For example, the impact value of an isolation fault in a PGS comprising 1,000 panels, where the isolation fault causes lack of power production for 30 minutes every morning, may have a value of 7, and an inverter that may not operate for a whole day at a smaller site may have an impact value of 6. It may seem that a non-functioning inverter implies a more severe problem, but this might not be the case, depending on the size of the PGS. An impact value calculation may automatically prioritize faults on a uniform scale across PGSs, based on the relative impact the fault has on each PGS, thus assisting the service provider to prioritize maintenance resources and fix the more severe fault first.

A formula for impact value calculation may incorporate a function (such as maximum, round up, median, average, etc.) to prevent a minor fault from receiving a negligible impact value. For example, when the period of time a fault is affecting a system is a small value, the period of time may be limited to a minimum value of 1 hour. A time value of a full day may be a number of hours that reflects the average number of power producing hours of the PGS. For example, the number of hours of sunlight in the day may represent the time duration of the day in hours. For example, the number of hours in the day may be determined by the month of the year. For example, the number of hours of sunlight in the day may be determined dynamically using an irradiance sensor.

Fault mappings may be represented using graphs, such as directed graphs and/or the like. A fault and/or an effect of a fault may be represented as a vertex and edges may represent dependencies, inter-relations, and/or the like. Fault mapping may be represented in a flowchart, such as a troubleshooting flowchart. Fault mappings may be represented as a knowledge base, an expert system, a database, a relational database, a hierarchal database, and/or the like.

In a first example scenario, an inverter is connected to 80 (eighty) PV generators (such as each PV generator comprising one or more solar panels, solar cells, or substrings or strings thereof), and an internet router connecting the inverter to the internet is not operational. As a result, the inverter cannot communicate system performance data to a user display, and an error "no communication from inverter" may be triggered. In addition, the 80 panel optimizers may not be communicating with the user display due to the router fault. In this example, it is clear that since the inverter is not communicating, the panel power is not being reported (such as, via connected electronics that may communicate with the inverter over the power lines) and the panel power may not be communicated to the user display, and there is no need to send 80 "panel not communicating" faults to a user display. The "panel not communicating" fault may be masked, since it is fully explained by a precedent fault. Thus, the faults may be presented more accurately when explained as a hierarchy.

In a second example scenario, an inverter is connected to 80 panels. Two panels are not communicating, resulting in two "panel not communicating" faults. Three weeks later, the internet router fails and is not communicating with a display of a user interface. As shown above, such an example scenario may also be the reason why none of the other panels are communicating. However, the router fault does not explain the fault affecting the two panels that were not communicating prior to the router being broken. Thus when the router is fixed, there may be other faults that caused the additional two panels to not communicate with the user interface. Therefore, the chronology of fault detection may affect the dependency mapping for a particular scenario. The notifications presented to a user on a display of a user interface may be:

Inverter not communicating, and

Panel not communicating (for each of the 2 panels), thus providing the user with a more accurate representation of the fault dependencies.

In a third example scenario, an inverter may have produced 60 kWh less energy in a predefined time period than a preset threshold. A fault notification of "inverter produced 60 k Wh less energy this week" might not provide sufficient description to locate, isolate, and repair the deficiency. A database may be analyzed to determine fault dependencies, and possible identify a root-cause of the failure, and subsequently may provide a detailed explanation about the cause of the energy-loss. For example, the following notifications may be presented to a user:

33 kWh loss due to burnt diodes, 20 kWh loss due to soiled panels, and 7 kWh loss due to an isolation fault.

Examples of how the fault mapping may be generated are: historic data analysis, real time updates from a central repository, comparison of similarity in patterns of faults, and/or the like.

Disclosed herein are aspects of techniques to automatically present fault notifications according to an inferred effect on the performance of a power generation system, such as a PV system.

In power systems, and in solar power generation systems in particular, faults may be categorized. For example, a category of fault types may be assigned by a user to a certain severity level selected from a list, or assigned by an installer of the system, or assigned by a manufacturer of a system, and/or the like. For example, possible severities a fault may be categorized to one or more of the following types: "fatal", "serious", "critical", "acute", "important", "significant", "blocking", "major", "medium", "moderate", "requiring attention", "minor", "negligible", "unimportant", "insignificant", or the like. For example, a first fault in a system may have a "blocking" severity level, while a second fault may have a "medium" severity level. The wording a particular category uses may have an effect on the user compliance with a mitigation procedure, depending on the user background, the regional social norms, the racial norms, the linguistic nuances, the semantic word usage, and/or the like. Severity levels may be a stratification of system impact values, power loss values, and/or the like. For example, stratification may be between 2 and 100 levels that represent that urgency of correcting the fault. As such, the urgency levels may change based on the installation, the service agreements, warranty status, and/or the like. The severity levels are the qualitative representation of the fault impact, a quantitative measure, for notification to a user to promote compliance with the maintenance needed on the power generation system.

A manufacturer of components of electronics systems, where the system comprises notifications for presentation to a user, may wish to restrict the words used in the notifications, while the equipment distributor/reseller, system installer, system end-user, and/or the like, may want to adapt or convert this list to an alternative preference in order to induce compliance of the end-user, introduce flexibility to the notifications, and/or the like. As the equipment is typically sold worldwide, across various nations, languages, cultures, and/or the like, the ability to provide both a comprehensive list suitable to the particular installations as well as the flexibility to cover diverse requirements, may introduce inconsistencies in design and testing of the equipment. To overcome this problem, a "smart" notification system may have mapping rules and data structures that allow both the equipment manufacturer, the distributor, the installer, the maintainer, the end-user, and/or the like to modify the rules and notifications to be suitable for an individual installation.

Disclosed herein are aspects of techniques to automatically prioritize fault and/or associated alert severities. The disclosure describes aspects of automatic techniques for categorizing each fault according to the impact the fault may have on the system performance. The impact value calculation may take into account the effect a particular fault may have on the system performance, costs, and/or other rules as may be determined by a manufacturer, and installer, an end-user, and/or the like. The impact value calculation may be associated with the power and/or monetary loss as a result of one or more faults. These impact values, such as one for each fault, may be used to determine a severity level depending on the installation parameters, cultural considerations, linguistic considerations, and/or the like.

The impact value and/or severity level may be representative of a physical and/or electrical parameter. For example, the impact value or severity level may represent results of a fault such as the watts of power lost, the watt-hours of energy lost, the dollars lost, the number of linear meters of PV panels lost, and/or the like. For example, when the feed-in tariffs vary by hour, the dollars lost due to a fault may be different during the peak load times, when the feed-in tariff is high, versus off-peak, when the feed-in tariff is low.

Automatically computing a severity level of a fault may be useful to reduce the time needed to specify/impress the severity of faults, to specify the severity of secondary faults based on the severity of primary faults, to specify the severity of faults that were not configured or known at the time of configuration and/or installation, to add severity categories that were not known or planned for previously, and/or the like.

In many scenarios, a fault's severity level or type may be dependent on additional factors, which may be unknown in advance. For example, a fault severity level may be dependent on a particular time, such as a higher severity level during a time when maximum power is being generated (for example midday) rather than at night, when no power is generated. For example, a user defines a new severity level of "MEDIUM" for monitoring faults of type "malfunctioning PV panel" during the winter when solar power is less important due to stormy weather. For example, a user may want to associate a fault with the notification text of "SEVERE", but "SEVERE" is not one of the possible severity levels/categories notification texts and a new notification text is defined as "SEVERE" for this purpose. A further example may be the user reviewing existing faults and update their severities to match the newly updated category type of "SEVERE", which when done manually may be time consuming, tedious, or error prone as the new level may be required to by entered manually for each fault.

For example, a single type of fault may have different severities based on the size of the installation. For example, a single panel fault may have a higher severity level for a small installation of 4 solar panels (severity of "severe") than for a large installation of 200 solar panels (severity of "negligible"). For example, the same fault may have different severities based on the importance of the specific fault at the specific installation and the specific time, such as when the power is near a threshold for a load power level at the fault time. For example, the severity level may be higher when a financial penalty may be applied to the user's account when the power generation reaches a threshold. For example, the severity level may be higher when the historic data of a site indicates that a future power shortage may be caused at the current power generation level. For example, severity levels may shift over time as the system ages.

Based on data collected by a solar power generation system, an evaluation of different metrics may be performed and the severity of faults may be set according to the impact on the power generated from the system. For example, a lookup table may be used to automatically convert between daily financial loss as a result of a fault and severity. The following table determines such a conversion:

TABLE 1

Financial loss based severity levels

| $ Loss per Day | Severity Level | Severity Type | Effect on Return on Investment (ROI) |
|---|---|---|---|
| $10 | 1 | Minor Loss | Little or no effect on ROI |
| $30 | 2 | Some Loss | Little or no effect on ROI |
| $70 | 3 | Moderate Loss | Some effect on ROI |
| $110 | 4 | High Loss | Some effect on ROI |
| $200 | 5 | Very High Loss | High effect on ROI |
| $350 | 6 | Extreme Loss | Unprofitable |
| $600 | 7 | Critical Loss | Unprofitable |

For example, when a PV module that produces energy worth $55 per day is broken, the system may automatically assign severity level 2 to this fault (using severity levels from TABLE 1). For example, when an inverter producing energy worth $575 per day is broken, the system may automatically assign severity level 6 to this fault (using severity levels from TABLE 1). For example, each fault notification or alert may be automatically assigned the severity level according to the percentage power production impact it has. Thus, in this example, an end-user may not have to pre-assign a severity to each alert. For example, the severity levels are dynamic.

For example, a fault affecting a PV production site may have a varying impact, depending on the site's total power production. For example, a severity level lookup table may be determined according to the percentage power production loss, such as the following table.

TABLE 2

Severity level according to power production loss percentage.

| % Power Production Loss (less than) | Severity Level |
|---|---|
| 5% | 1 |
| 16% | 2 |
| 27% | 3 |
| 38% | 4 |
| 49% | 5 |

TABLE 2-continued

Severity level according to power production loss percentage.

| % Power Production Loss (less than) | Severity Level |
|---|---|
| 60% | 6 |
| 71% | 7 |
| 82% | 8 |
| 93% | 9 |
| 100% | 10 |

For example, in a PV system with 4 identical solar panels, when one panel stops producing power, a 25% loss of power production is caused and the severity level would be automatically set to a value of 3. For example, in a PV system with 200 identical solar panels, when one panel stops producing power a 0.5% loss of power production is caused and the severity level would be automatically set to a value of 1. Thus, for a percentage power production represented by a loss table (such as TABLE 2) the same fault may result in different severity levels depending on other factors (such as the system's total power production). For example the percentage loss may be relative to the annual average output for that day of the year, relative to the preceding week, relative to the expected output based on the forecasted solar irradiance, and/or the like.

The notification system used to notify users of faults may comprise both multiple levels of faults, multiple levels of severity, multiple notification addressing targets (such as different users responsible for different types of faults), grouping of fault notifications from multiple sites, multiple authorization levels of fault handling (such as technician, manager, owner, end-user, and/or the like), and/or the like. The fault dependency mappings may be preset to an assumed mapping scenario (such as default mappings). The fault dependency mappings may be adjusted manually. The display of data using these methods allows a human operator to identify patterns or anomalies in the data that may give insight into regional or systematic problems with the equipment or installations.

The notification system may comprise fault management workflows, such as flowcharts for how specific faults are handled. For example, a fault notification may be automatically generated based on a performance fault, set to a "snoozed" state by an end user, relayed to user interface of a maintenance or installer monitoring system, set to an "in progress" state by a repair technician, and set to a "closed" state by a maintenance manager, and/or the like.

For example, a fault identification is a result of a failure of a component of the power generation system, such as a hardware component, the fault is detected by a second component of the system, and the second component generates the fault identification.

For example, a fault identification is generated by a computerized device associate with the power generation system, such as an inverter, an optimizer, a smart PV panel, a central computer, a smart home computer, a utility company computer, an installer computer, a service provider computer, a manufacturer computer, and/or the like.

Fault categories may include:
Installation/Setup,
Equipment,
Performance,
Communication,
Environmental,
Grid,
External commands,
and/or the like.

For example, Installation/Setup fault types may include:
String configuration (such as an installer sets up a short string which may generate a low DC voltage, or a long string which generates a high DC voltage),
Import/Export meter is installed in reverse direction,
Incompatible optimizer installed, for example a 60 V optimizer connected to 100 V panel,
Over-current/over-voltage in optimizer input (from PV module),
Meter calibration (such as a conversion of a meter sensor value to a power value) is incorrect,
Energy storage battery is connected in reverse polarity,
Inverter's temperature is high/power derating is implemented for a predefined time, such as for 3 days,
Faulty connection to grid, AC voltage too high for a predefined number of days (but may not trip breaker),
County-code incorrectly set,
Grid-bad installation impedance,
Inverter not configured correctly, for example configured to be always at 60% power,
Internal battery circuit breaker turned off,
Incorrect version of firmware is installed on inverters (recommendation/warning),
and/or the like.

Examples of performance fault types may include:
A PV system's performance ratio (as defined below) is less than a threshold percentage, over a period of time,
Inverter/String/Panel is underperforming compared to similar-element systems in the same geographical region,
Underperformance (such as, due to partial shading) of one or more panels,
Approaching "power to grid export limitation" in a predefined time threshold,
PV System/Inverter output power exceeds the limitation defined by the grid-curtailing power for more than a predefined number of hours due to export limitation,
and/or the like.

Examples of "no communication" fault types may include no communication from a site, an inverter, string, optimizer, battery, home device, and/or the like.

Examples of differentiating between communication and production problems may include:
An inverter not communicating while other devices of the same system are communicating may indicate a communication board problem,
An inverter not communicating while an on-site power meter shows power production as being above a threshold and/or increasing may indicate a communication board problem,
An inverter and an on-site power meter reporting different power production data may indicate a communication or measurement problem,
and/or the like.

Examples of environmental fault types may include:
Snow/dust/dirt on PV panel,
Lightning hit a PV system component, such as a PV panel, a cable, a converter, an optimizer, and/or the like,
Vegetation shading one or more PV panels,
and/or the like.

Examples of equipment fault types may include:
Inverter internal fault, such as a faulty component of the inverter detected during self-testing,
Inverter is not producing energy, such as power/energy production below a threshold, Revenue grade meter (RGM) variance, such as when an inverter's power production reporting does not equal a power meter's production reporting, String Potential-induced Degradation (PID), such as a specific string demonstrates PID over time, DC isolation error may occur when a specific inverter reports isolation errors a number of times during a specific time period (such as, three or more over a one-hour period), Bypass diode burnt, Arc detected, Solar tracker error, such as reporting from a solar tracker (such as at a specific solar orientation the panel may be partially shaded), Power device reports internal error, and/or the like.

Examples of battery fault types may include:

Battery temperature is irregularly high or low over a time period,

Battery did not charge/discharge in the last time period,

Battery low state of charge/health,

Auxiliary battery (such as a 9V alkaline backup battery) needs to be replaced,

Battery has internal critical alert, such as defined by a table of alerts for the battery. The inverter may receive a notification from the battery when an internal fault occurs. In such case, the internal alert may be presented, such as with an internal error code and/or the like, Battery End-of-life is approaching, such as according to a measured internal battery resistance and/or the like, and/or the like.

Examples of grid fault types may include:

Grid alerts, such as over voltage, under frequency, and/or the like,

Unstable grid (voltage),

Inverter shut down eminent, such as due to overvoltage for a time period, grid frequency too low for a time period, and/or the like.

Some notifications may exclude faults for certain components, such as excluding a specific panel due to partial shading. Some notifications may be marked as a "known issue" and the system may pause notifications for this fault for a time period.

Some fault alerts may comprise an adaptive threshold, such as when the system learns over time that a user dismisses certain alerts, certain alerts during certain times, and/or the like. In some scenarios, the system may adjust the threshold automatically, automatically send a query to the user to adjust the threshold, and/or the like.

Some faults may be the result of a configuration change, such as when an end-user changes a configuration parameter, a fault notification may be sent to a maintenance contract service provider and/or the like.

An inverter may send a fault notification when preparing to shut down, nearing an operational threshold that when reached may result in a shutdown, and/or the like. When a fault or alert of pending shutdown is received, other system components, such as a repository of a client terminal, may be prepared for receiving a shutdown memory dump from the inverter and/or the like.

In some scenarios, the fault mapping may include priority rules for presenting notifications on the user interface. For example, when both an inverter and a string experience faults, a priority rule may give priority to the inverter fault notification over the string fault notification. For example, when a power production fault and isolation fault occur together, and the mappings specify that the isolation fault is the root cause of the power production fault, a priority rule may give priority to the isolation fault.

Some fault notifications may be the result of an analysis of performance timelines, comparison of performance timelines (such as over a time period) with similar systems in the same/similar geographical regions, subsystems of the same PV system (such as between parallel strings and//or inverters), and/or the like. For example, when there is a pattern of low power production at certain times of the day, or certain days in the year, there may be shade from an object obscuring the sun at these times.

Some faults may be triggered based on a rate of change of a performance parameter and/or metric, such as when there is a slow degradation of a PV panel power production. For example, where a PV power production is slowly decreasing week-by-week from 95%, to 92%, 87%, and/or the like, a warning may be presented to a user that the current trend may reach a threshold of 70% within an amount of time calculated by the rate of change. Thus, a fault of reaching the threshold may be mitigated by preemptively correcting the cause of the degradation.

Some power production faults may be caused by other faults. For example, an inverter receiving power from two strings may cause the two strings to generate a string fault when there is an inverter fault. For example, when a router fault occurs, there may also be an inverter fault, one or more string faults, one or more optimizer faults, and/or the like. Some faults may be caused in part by other faults. For example, when a panel low power production fault notification is enabled, a fault indicating a reduction of 60% in power production may be received from the optimizer, and a burnt bypass diode fault may be received (which may explain 33% of the low power but not the remaining 27%). The system may present different notifications based on the low power notification threshold. A threshold of greater than 30% power loss may result in the presentation of a notification of a burnt bypass diode fault, but a threshold of greater than 20% power loss may result in the presentation of both a burnt bypass diode fault and a weak panel fault.

The time between fault detections may be used to determine root cause. For example, when a panel communication fault is received two days before an inverter communication fault, it may be that the two faults are unrelated, and both may be displayed. For example, when an inverter communication fault is received, and immediately after a communication fault is received for all panels, it may be clear that the first failure is the cause of the second failures, and only the first failure may be presented.

The performance impact value or severity level of a specific fault may be adjusted based on same values for the root cause faults of the specific fault. For example, a panel output is 60% less than expected, which may be considered a weak panel of 60% loss, but when a second fault is a burnt diode fault, that explains 33% loss, the weak panel loss may be adjusted to 27% and presented together with the burnt diode loss of 33%. Some faults may be presented even when a root cause is known, such as a performance ratio (PR) fault of less than a threshold may be presented even though a root cause of the PR loss is known.

An impact value equation or formula may assist in determining severity level, priority, presentation sequence, and/or the like. For example, the impact formula may help a maintenance contractor provide service to the severest faults (such as by prioritizing) in one or more systems and/or in one or more regions. For example, the impact formula may be representative of the performance loss, the financial loss, the relative system importance to a group of users, the maintenance contract grade (such as a silver, gold, platinum grade, and/or the like). For example, a first region may comprise many lower severity faults and a second region may comprise just a few high severity faults and the combined impact of the first region is greater than the combined impact of the second region and the maintenance to the first region is therefore prioritized. Some faults may not impact the performance, such as cause financial loss, and may represent a fixed impact, such as a maintenance reputation impact. Some impact formula may be represented in value units that are not directly connected with energy performance or financial loss.

The impact value may be a representation of a physical and/or electrical parameter. For example, the impact value or severity value may represent results of a fault such as the watts of power lost during a time, the watt-hours of energy lost, the dollars lost, the number of PV panels not functioning as a result of the fault, and/or the like. For example, when the feed-in tariffs vary by hour, the dollars lost due to a fault may be different during the peak load times when the feed-in tariff is high versus when the feed-in tariff is low. For example, an isolation fault during the morning or evening due to moisture for one hour may have a much lower impact than a shading at midday during peak irradiance.

The impact value formula may comprise a term representing the loss in energy/power/cashflow/wealth and/or the like. The impact value formula may comprise a term representing the effect of the time the fault was active, such as a temporal term, whether it be the number of days, the number of hours, the time of day, and/or the like. The impact value formula may comprise a term representing the reduction of the impact value due to other faults on the system, such as root cause faults, major faults that overshadow the present fault, and/or the like. For example, the impact value formula computes a normal system energy output, and then subtracts the current energy production, the power times the expected number of hours the fault may be in effect, the total energy loss since the first instance of this fault, and/or the like. The impact value formula may further comprise a transfer function to convert the terms to a value, such as a linear transfer function, an exponential transfer function, and/or the like.

For example, the scale of the PV system, such as the total power, may be expressed in an equivalent number of panel units. For example, a small 1 kilo-watt (KW) PV system may have three panels, and one panel has a fault of no power, the impact may be 1 out of 3 panel loss. For example, the impact formula output value is converted to a log scale. For example, the impact formula output value is a qualitative value that may have a large tolerance, such as 100%, 200%, 300%, or the like.

The impact formula may remove root cause impact values when computing a specific fault's impact value. The impact value, such as the loss of performance due to a fault, may be converted to a severity level. Following is an example table for converting a number of panels loss in performance to a severity level of the fault.

TABLE 3 panel loss to severity level.

| Loss (number of panels) | Severity Level |
|---|---|
| 1/10 | 1 |
| 1/3 | 2 |
| 1 | 3 |

TABLE 3-continued panel loss to severity level.

| Loss (number of panels) | Severity Level |
|---|---|
| 3 | 4 |
| 10 | 5 |
| 30 | 6 |
| 100 | 7 |
| 300 | 8 |
| 1000 | 9 |
| 3000 | 10 |

Formulas may be used to calculate the impact value, where the formula may contain electrical parameter terms, temporal terms, root cause terms, and/or the like.

For example, the impact value may be the output t of a formula:

$$L = e(\text{power, voltage, current}) \cdot t(\text{time}) - L(\text{Root Cause faults})$$

where the function e( ) takes as input the electrical parameters of power, voltage, current and/or the like, associated with the fault identification, where the function t( ) takes as input the time the fault associated with the fault identification was active or may be active in the future, and the function L(Root Cause faults) is the impact values calculated for the root causes of the fault identification according to the mapping. For example, the electrical parameter term multiplied by the temporal term may yield an energy term. For example, an energy term may replace the electrical parameter term and the temporal term.

For example, an impact value calculation formula may be:

$$L = (\alpha \cdot \#p + C) \cdot \max_{days}\left(\frac{\text{fault time during each day}}{12 \text{ hours}}\right) - L(\text{all Root Cause faults}) \qquad \text{EQN. 1}$$

where $\alpha$ denotes a predefined parameter for each alert, #p denotes the number of panels affected, and C denotes a fixed value for certain faults.

The impact value may be computed using the equation IMPACT:=floor(log(L)), or other formula as required by the installer, service provider, and/or the like.

The first term of EQN. 1, ($\alpha \cdot \#p+C$), may be a function that converts the number of panels lost into a value corresponding to the impact. In this example, the function is linear, but other functions may be applied that reflect the relationship between the number of panels lost to the qualitative impact that may have on the user's PV system, such as a power law, a polynomial law, an exponential law, and/or the like. The second term, $$\max_{days}\left(\frac{\text{fault time during each day}}{12 \text{ hours}}\right),$$

may be the maximum time duration during any day of the fault, which represents the time the fault was active for the most time during any of the days.

In this example, the time formula is a simple linear function, but other functions may be used that represent the time according to the irradiance on a fixed tilted surface as a function of the hour of the day. For example, earlier and later hours in the day have less irradiance do to incidence angle on a fixed angle PV panel and a corresponding integral sine function may capture this. Other bell-shaped functions may be used to emphasis other effects of the incident angle between the sun and the panel surface, such as integration of the times the fault was active. The effect of power loss may be integrated over the time to give an accurate value for non-symmetrical functions, such as functions where the rising sun is stronger than the setting sun, such as functions that account for the cloudiness during each of the fault days, such as functions that integrate the actual power output during the fault from the PV system, and/or the like. For example, an integration of power over time may give an energy value that can be used to determine an impact of a fault on the loss of energy generation in a PGS. For example, patterns of power and/or energy loss may be used to determine that a fault is occurring, and may be used to identify the fault.

Faults may be determined by meta-analysis of data from multiple PGS sites. For example, a rare fault may not occur at a frequency sufficient to determine the pattern of power loss from the rare fault, but analysis of multiple sites from a large region or from all similar sites from any region taking into account the irradiance differences between regions, may determine the patterns of power loss that indicate the rare fault has occurred, may be eminent, or the cause of the rare fault. For example, a fault from environmental humidity conditions combined with certain hardware components may be determined by comparing all sites that have that combination of conditions and components. Certain faults may be not result in a notification when metadata determines that the identified fault is not a fault of the PGS. For example, radiation conditions may affect the power production, such as a solar eclipse, and the affect may be determined to be a non-fault effect when the sites across a large region are compared, and some of the sites may have a radiation sensor.

The temporal term in the impact equation may also be modified according to the number of days the fault has been active. For example, the first day may be a linear formula, the second day may add a weighting factor indicating a greater impact, the third day the total impact since the first day of the fault may determine that the impact has reached a threshold and the severity increased to "critical", and/or the like. In this way, the service provider may give higher weight to faults that have been active for more days, thereby improving a reputation of the service provider.

For example, a PV system fault has the values:

| Term | Value |
|---|---|
| A | 1 |
| #p | 360 |
| C | 0 |
| Time duration | 12 hours | resulting in the L value calculation:

$$L = (1 \cdot 360 + 0) \cdot \frac{12 \text{ hours}}{12 \text{ hours}} - 0 = 360$$

and an impact value of 8.

For example, an isolation defect effecting 360 panels for 30 min results in the L value calculation:

$$L = (0.5 \cdot 360 + 0) \cdot \frac{30 \text{ min}}{12 \text{ hours}} - 0 = 7.5$$

and an impact value of 4.

For example, a burnt diode may result in the L value calculation:

$$L := \left(1 \cdot \frac{1}{3} + 0\right) \cdot \frac{12 \text{ hours}}{12 \text{ hours}} - 0 = \frac{1}{3}$$

and an impact value of 2.

For example, a weak panel may result in the L value calculation:

$$L := (1 \cdot 1 + 0) \cdot \frac{12 \text{ hours}}{12 \text{ hours}} - L(RootCauses) = 1 - \frac{1}{3} = \frac{2}{3}$$

and an impact value of 2.

For example, a string too long defect may result in the L value calculation:

$$L := (0 \cdot 0 + 1{,}000) \cdot \frac{12 \text{ hours}}{12 \text{ hours}} - 0 = 1{,}000$$

and an impact value of 9.

For example, a defect comprising 4 panels not producing power for a half day yesterday and all of today may result in the L value calculation:

$$L := (1 \cdot 4 + 0) \cdot \frac{12 \text{ hours}}{12 \text{ hours}} - 0 = 4$$

and an impact value of 4.

For example, a defect comprising a string of 20 panels performing below average (such as at 62%) may result in the L value calculation:

$$L := (1 \cdot 20 \cdot 0.28 + 0) \cdot \frac{12}{12} - L(RootCauses) = 5.6$$

and an impact value of 4.

The performance ratio (PR) is the ratio of the actual and theoretically possible energy outputs.

For example, a defect comprising 360 panels at 75% PR may result in the L value calculation:

$$L := \left(1 \cdot 360 \cdot \left(\frac{15}{90}\right) + 0\right) \cdot \frac{12 \text{ hours}}{12 \text{ hours}} - 0 = 60$$

and an impact value of 6.

Other formulas may be based on kilo-watt-hours lost due to the fault. The formulas may comprise a transfer function that is a linear function, a logarithmic function, an exponential function, a power function (such as raised to the x power), a polynomial function, and/or the like. A basic method for computing the impact value would be to compute the electrical loss due to the fault, and then convert that to a value that is scaled as needed for the notification policy. When the electrical loss value is not known, or difficult to compute, the loss in energy may be converted to an electrical parameter term multiplied by a temporal term for example. The temporal term may take into account the maximum time the power was lost, the average time, the median time, the total time, and/or the like.

For example, the impact value may be computed with a formula representing a panel's nominal power:

$$T * \sum_{i=1}^{\text{number of panels}} (a_i * P_i)$$

where $\alpha_i$ denotes a coefficient, such as determined by the tilt and/or azimuth of the PV panel, $P_i$ denotes the nominal power of panel i, and T denotes the time the fault was active during daylight hours.

For example, the impact value may be computed with a formula representing a panel's power immediately before the fault occurred:

$$T * \sum_{i=1}^{\text{number of panels}} (P_i)$$

where $P_i$ denotes the power of panel i before the fault occurred, and T denotes the time the fault was active during daylight hours.

For example, the impact value may be computed with a formula representing a panel's power immediately before and immediately after the fault (that caused the loss) occurred:

$$T * \sum_{i=1}^{\text{number of panels}} \left( \frac{Pi_{start} + Pi_{end}}{2} \right)$$

where $P_i$ start denotes the power of panel i before the fault occurred, $P_i$ end denotes the power of panel i after the fault occurred, and T denotes the time the fault was active during daylight hours. For example, this formula may be used to retrospectively determine the impact value.

For example, the impact value may be computed with a formula representing a panel's historical power:

$$T * \sum_{i=1}^{\text{number of panels}} (a_i * P_{i-average\ in\ last\ X\ days})$$

where $\alpha_i$ denotes a coefficient, such as determined by the tilt and/or azimuth of the PV panel, $P_i$ denotes the average power of panel i over the last X days, and T denotes the time the fault was active during daylight hours.

For example, the impact value may be computed with a formula representing a panel's power estimated from sensor readings:

$$T * \sum_{i=1}^{\text{number of panels}} (a_i * P_{i-according\ to\ sensor})$$

where $\alpha_i$ denotes a coefficient, such as determined by the tilt and/or azimuth of the PV panel, $P_i$ denotes the estimated power of panel i according to a sensor measurement, such as an irradiance sensor measurement, and T denotes the time the fault was active during daylight hours or is estimated to be active at a future time, such as the active time over the next daylight period, 24-hour period, 7-day period, 1-month period, or the like. For example, the time period is computed to be 5 hours every Monday, and over an example calendar month this results in an estimated 25 hours. As used herein, estimated times may be computed using previous times, historic records, formulas, rules, and/or the like.

For example, the impact value may be computed with a formula representing a panel's power estimated from a printed circuit board (PCB) version:

$$T * \sum_{i=1}^{\text{number of panels}} (a_i * P_{i-according\ to\ PCB\ version})$$

where $\alpha_i$ denotes a coefficient, such as determined by the tilt and/or azimuth of the PV panel, $P_i$ denotes the estimated power of panel i according to a PCB version, such as a PCB version with known fault issues, and T denotes the time the fault was active during daylight hours. For example, when historic data shows that an optimizer with PCB version D is in operation for one month, there may develop issues with the terminal connectors on the PCB that result in a 50% loss of power.

For example, the impact value may be computed with a formula representing a panel's power estimated from adjacent panels and/or systems:

$$T * \sum_{i=1}^{\text{number of panels}} (a_i * P_i)$$

where $\alpha_i$ denotes a coefficient, such as determined by the tilt and/or azimuth of the PV panel, $P_i$ denotes the estimated power of panel i estimated from adjacent panels and/or systems, such as a panels of the same type (on the same system, a system in a similar region, and/or the like), and T denotes the time the fault was active during daylight hours.

A formula may have a constant, denoted C, that may be dependent on the fault type, the specific fault, the specific system, and/or the like. For example, a PV system may have the values of C set to zero for all faults when there is no need for an increased impact value independent of the lost power/energy. For example, a demonstration system may have values of C set to high numbers for all faults when there is need for service on all faults as fast as possible.

In the impact value formula, the term representing time, such as a temporal term, may have different calculations. For example, the value of T may be based on:
the total time since the fault started,
the number of times the fault notification was displayed to the user,
the time since the fault started until the fault was resolved, for all days the fault was active, the day that had the longest fault time, for all days the fault was active, compute a formula that takes the time of the fault each day, times a weighting factor of max(1−0.1*number of days ago), such as a weighting factor of 1.0 for today, 0.9 for yesterday, and/or the like.

For example, an isolation fault may be intermittent at certain times of day, such as when the humidity is high. Since the impact values and the fault duration is dependent on the temperature, humidity, irradiance, and/or the like, it may be difficult to give an average daily value. In such an example, we may want to give the maximum observed value, a maximum estimated value, a maximum future predicted value, and/or the like. For example, a partial shading fault may be intermittent and may be dependent on the wind speed and time of day.

A fault that has been active for a long time may have an increased impact value or an adjusted time value to emphasize the time effect of the power/energy lost (such as with compound interest).

An example scenario of when one calculation is used over another may be when a PV system has different time-of-use tariffs. For example, when a user uses electricity at noon time it may cost more than the cost of electricity in the in the mid-morning. Thus, when a fault causes the PV system to fail, the user may have to purchase electricity form an alternate source, such as the grid, and the loss may be the alternative cost of electricity and the loss of income. In this example, the formula, denoted f( ) be based on the amount of unproduced kWh according to the times and electricity tariffs during the fault. For example, the estimated amount of unproduced energy may be based on historical data, such as by examining the PV system's historical production in the same times as the fault.

Another example scenario of using different formulas may be when an installer or service provider has a contract to provide a certain level of service, such as fault correction within 2 hours. For example, the installer or service provider has guaranteed a minimum production of 10 kWh per day, and when less energy is produced the installer/provider may compensate the user the full amount of 10 kWh of energy. In this example, the impact value may be high when the system produces less than 10 kWh in a specific day.

Another example scenario of using different formulas may be when the impact value of older faults decreases each day. Some faults may be set up so that the impact value increases as the number of days increases, such as to predict the total impact over the life of the fault when it may be that the fault notification is not noticed by the user. In another example, the power produced by an adjacent, similar PV panel is used to estimate the power lost.

Another example scenario may be when a user lives in an area with highly unstable climate (such as New Zealand), the user has installed a string of panels on the roof, and all panels have stopped producing for 30 minutes. Here, adjacent panels energy/power may not be used since all panels are not producing, and the lost power may not be estimated with historical data due to the sporadic climate in this area. Thus, in order to estimate the power lost, a formula may average the power before the fault and after the fault. Since the system stopped producing for 30 minutes, this estimation may reflect the lost power. The formula used and the impact value calculated may depend on the mapping which comprises rules for when to use different formulas for different faults, the environmental conditions, and/or the like.

Profiles may be used to represent a set of configured rules. For example, a PV installer may define a set of rules (profiles) and use the profiles for multiple installation sites. For example, a first profile is used for new installation during a break-in period and a second rule after 3-months of successful operation. Each rule may have customizable condition parameters. For example, the second rule may depend on the service contract type, or prospects of neighbors purchasing a system form the installer after a successful break-in period. A manufacturer may provide default profiles for different sites based on analysis of historical data, heuristics, opinions, and/or the like. The profiles may be customized, such as amending each rule according to specific criterion (such as contract type, PV system/site size, site location, and/or the like).

A fault may generate an alert, where each alert may include:

Alert information, such as a site name, an alert name, an impact and/or severity level, a date of alert, etc., Resolution recommendation, Actions on alert (lifecycle state change, show in layout, show chart, assign to user, etc.), and/or the like.

Similar alerts for the same site may be grouped, such as alerts for 50 malfunctioning panels alerts may be grouped as one alert indicating the number of panels (50 panels in this example).

Each alert may have a lifecycle, such as different stages/statuses that the alert goes through. To track an alert's progress, the following statuses may be used:

Open unread,

Open read,

In progress,

Support ticket was opened,

Snooze (the snoozed alert may be hidden for a time),

Closed,

Custom status, and/or the like.

An alert status may be set/updated automatically by a component/device/system/another alert, set/updated by a user/installer/service technician, and/or the like.

Actions may be performed on alerts, such as:

Exclude certain components from an alert type, such as exclude specific panel due to shadow (known issue), Set a new threshold for this/similar components, See history of this alert/component, See the alert in a corresponding chart/layout, Change an alert's status (open/pending/in progress/ . . . ), Assign the alert to be handled by a specific maintenance person, organization, manufacturer, and/or the like, Open a support ticket where relevant information may be filled automatically, Escalate/degrade an alert severity, and/or the like.

These and other operations may be performed as a bulk-operation across multiple alerts, components, types, and/or the like.

Alerts may be retriggered periodically, as reminder, and/or the like. For example, a repeating alert that is already open in the system regarding an issue, may not derive any change, since it is already open and this alert is being monitored. For example, an alert for an issue shown the past and closed, may be defined as "persistent", such as an isolation fault. Some alerts may be shown with the previous alert context. Some alerts may be allowed to be dismissed by a user and/or hidden. For example, the recurrence of an alert may be considered an example of upgrading the severity level of the alert.

For example, a set of rules (such as a profile) may include a root-cause analysis, an impact calculation, and profiles to determine the alert to present to an end-user/operator. For example, five profiles may be supplied by the manufacture as out-of-the-box profiles. Visualization of an alert may be based on a read-only configuration. For example, a profile may be assigned at a site-level when the site data is created. For example, a profile may be assigned to or updated for a site. For example, an alert may be visualized as a list view with cross-sectional filters, such as a per-fleet filter, a per-site filter, and/or the like. The alerts may include alert fields, such as alert type, category, site, alert start timestamp, alert end timestamp, description, resolution, and/or the like. The alert presentation may include an action, such as view in chart or list layout, exclude components from alert, change alert threshold, and/or the like. Alert actions may include sorting of alerts. Default profiles (such as out of the box profiles) may include a notification policy, such as which alerts to send to which users, email notifications, and/or the like.

Equipment faults may include:
Inverter fault,
Arc detection,
DC Isolation fault,
Not available today might take high effort,
Inverter in standby/locked mode,
Battery fault,
String fault,
Weak panel number X,
Burnt bypass diode panel number X,
Inverter is not producing energy,
Inverter energy below threshold,
Site's PR is less than X % over a Y period of time,
RGM variance,
Inverter's production does not equal meter's production by X %,
and/or the like.

Communication alerts may include no data from site, inverter, meter, optimizer, battery, and/or the like.

A setup and/or installation alert may include a string configuration alert, such as a short string, a long string, and/or the like. Some alerts may include different types of sub-alerts, such as a no communication with inverter alert may include a no internet connection sub-alert or other details about the internet connection. For example, a partial shading alert may include a suspected vegetation shading sub-alert.

Infrastructure capabilities of a PGS system may include conditions and/or root-cause relations between rules, an ability to differentiate between communication and production errors, access to inverter's parameters and configurations, and/or the like.

Metadata may be retrieved or acquired to assist in analyzing faults on a specific system. For example, weather data may be acquired from a repository, or an online weather service application programming interface (API), a database, and/or the like. For example, a sequential query language (SQL) script for retrieving weather data is sent to a news database server, the weather data is retrieved, and the weather data is associated with a PV system fault of partial shading due to snow (ambient temperature less than 0 degrees Celsius). For example, the weather report indicates that there has been snow falling for 7 hours, the snow is expected to stop in 18 hours, so the notification of the PV system fault of partial shading due to snow is presented with the weather forecast and a suggestion to set a reminder to clear the POV panel after the storm has passed.

For example, the partial shading fault may be due to a dust storm, the weather report indicates the dust storm may end in 10 hours, and the user is presented with an option to set a reminder for cleaning the PV panels. For example, the fault data for PV systems in a geographic region are correlated to determine that the weather is overcast and the PV system in that region are operating at 60% of capacity due to decreased solar irradiance. Many sources of metadata may be retrieved for augmenting, analyzing, or understanding the fault data of the PV system, and at least some of the metadata may be presented to the user with the fault notification. Metadata may be retrieved and/or collected from many sources, such as a database (such as using an SQL query), a knowledge-based platform (such as using an API), an advertising platform (such as using an API), a search engine (such as using a natural language text query), and/or the like.

Reference is now made to FIG. 1, which shows schematically an example system 100 for fault notification in photovoltaic (PV) systems. System 100 comprises at least one hardware processor 101, a storage medium 102, a user interface 120, and/or a network interface 110. Network interface may connect the system, using a network 140, to one or more PV systems 131 and 132 and/or a world wide web (WWW) repository or web site 133. For example, PV systems 131 and 132 are communicated with using power line communications and WWW site 133 is communicated with using TCP/IP protocol.

Storage medium 102, such as a non-transitory computer-readable storage medium, may have stored thereon, processor instruction that, when executed on hardware processor(s) 101, configure hardware processor(s) 101 to perform aspects of the disclosed features. For example, a Data Gatherer 102A, which may be defined by a group of processor instructions, such as a software module, and may be configured to receive one or more fault identifications, comprising data about the fault, and may retrieve other information from a different PV system, a WWW site/repository, a database, and/or the like to help analyze the cause of the fault or impact of the fault on the PV power generation system. Data Gatherer 102A may also be configured to retrieve a mapping, such as a mapping of fault rules, policies, dependencies, and/or the like, that may be used to determine the impact and notification needed to be presented on user interface 120 for this fault. An Impact and/or Cause Calculator 102B, which may be defined by a group of processor instructions, and may be configured to use the fault identification, mapping, rules, and other retrieved data to compute an impact value for the fault, and a Fault Alerter 102C, which may be defined by a group of processor instructions, and may be configured to formulate a notification to be presented to a user on a display of user interface 120, where the notification may be based on the fault identification, the mappings, the rules, the metadata, and/or the like.

Figure 2:
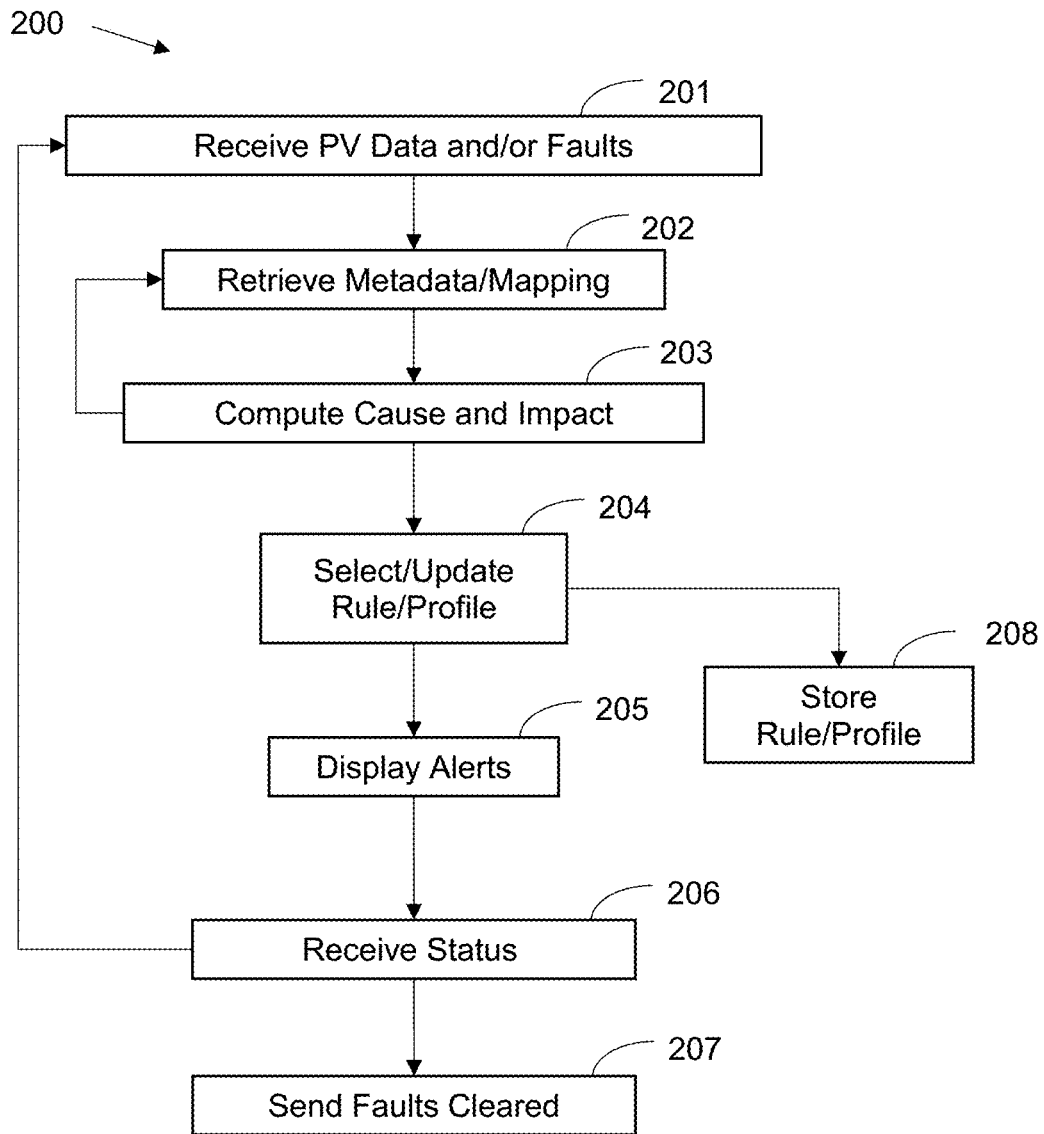
FIG. 2 shows an example flowchart of a method for fault notification in PV systems.

Reference is now made to FIG. 2, which shows an example flowchart of a method 200 for fault notification in PV systems. Method 200 may be executed by a central control device such as a computerized device, a server, a power controller, a power inverter, and/or the like, and all steps may be performed by a hardware processor or controller of the device. Method 200 may comprise step 201 of receiving the PV data and fault identification. The method may comprise a step 202 of retrieving metadata related to the PV data and/or fault identification. At step 203, a cause and impact may be computed based on the metadata, the PV data, the fault identification, and/or the like. Based on the computation (step 203), the controller or device carrying out method 200 may iteratively perform, at steps 202 and 203, the retrieving and computing, such as to refine the information needed to present as a notification of the fault. The method may comprise an action of selecting and/or updating 204 rule and/or profile, to determine the final details of a notification and/or action for display step 205 of the fault on user interface 120. The rule/profile may be stored for future use, recording of the fault, and/or the like, in step 208. After notification display (step 205), a status may be received in step 206 that defines the actions a user, installer, maintainer, and/or the like, may take in resolving the fault, and the method may repeat form receiving step 201 as long as there are faults being reported as active on the system. When no faults are active, a fault cleared notification may be sent in step 207.

The following screenshots of FIG. 3 thru FIG. 28 may include example names and text that are used for illustrative purposes only, such as fictional names, places, and text in non-English languages. These are used as examples of names, places and text only, and are not intending to limit the disclosure to the specific examples used.

Figure 3:
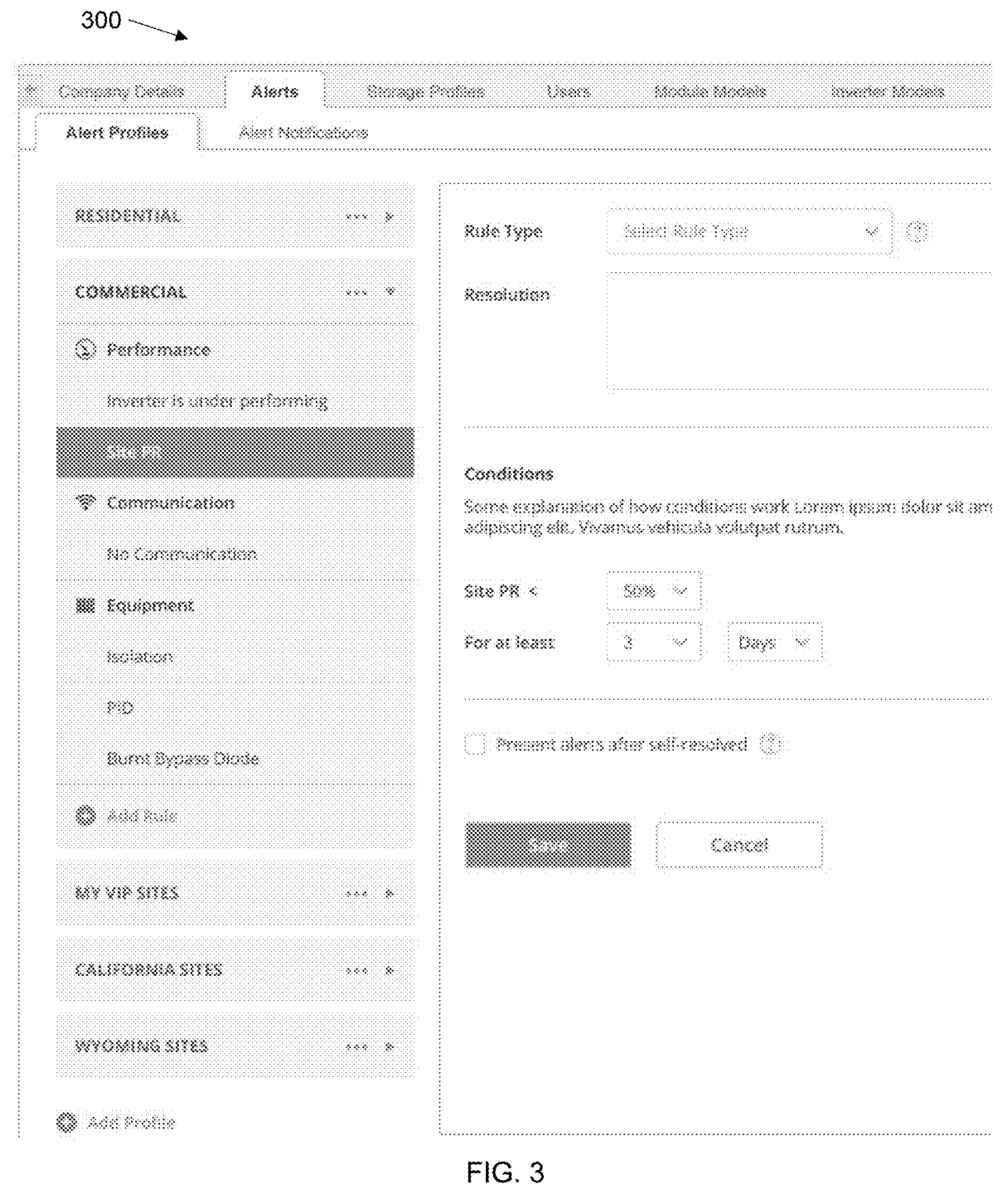

Reference is now made to FIG. 3, which shows an example screenshot 300 of rule definition in a PV system fault presentation. As used herein, the term screenshot means a graphic representation of a user interface during operation of a computerized device that may be configured for implementing features of the disclosure. Profile based rules are used for each type of system user, for example a commercial user may have a rule where a performance ratio of less than 50% for at least 3 days may produce an alert. In this manner, each type of user may have certain rules for generating alerts and notifications that the responsible entity, such as a maintenance provider, service provide, manufacturer, and/or the like, wishes to configure. Similarly, other faults may be assigned alert and/or notification rules, such as a PID alert above 20% generates an alert, no communication for more than 4 hours generates an alert, and/or the like.

Figure 4:
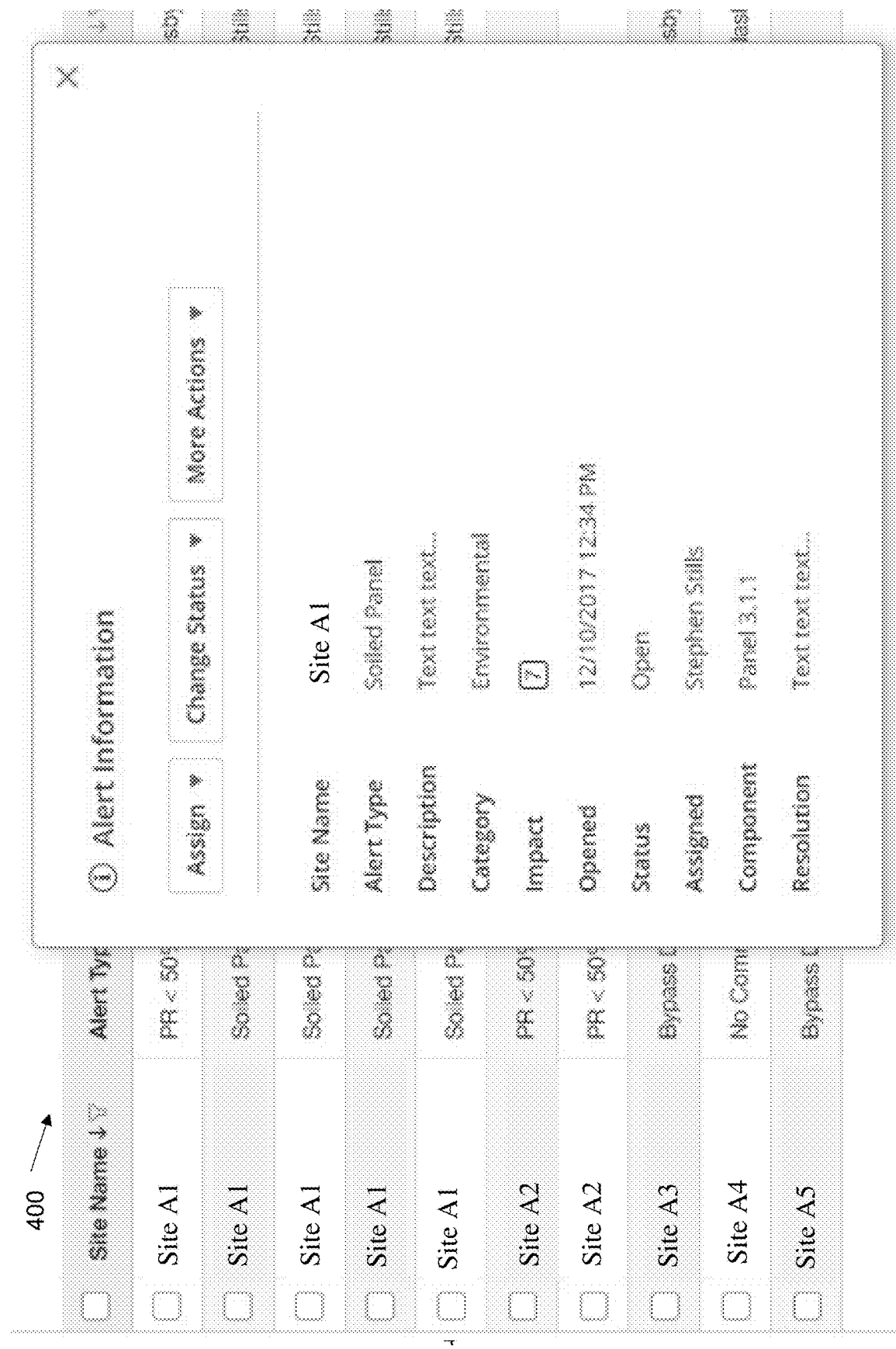
FIG. 4 shows an example screenshot of impact calculation in a PV system fault presentation.

Reference is now made to FIG. 4, which shows an example screenshot 400 of impact calculation in a PV system fault presentation. For example, by clicking on an alert, the details of that alert may be viewed, including the impact value calculated from the formula and mappings. For example, details may include site name, alert type, alert description, alert category, alert impact, time when alert was opened, alert status, person alert has been assigned to, component that caused the alert, or resolution status of the alert.

Figure 5:
FIG. 5 shows an example screenshot of component details in a PV system fault presentation.
Figure 7A:
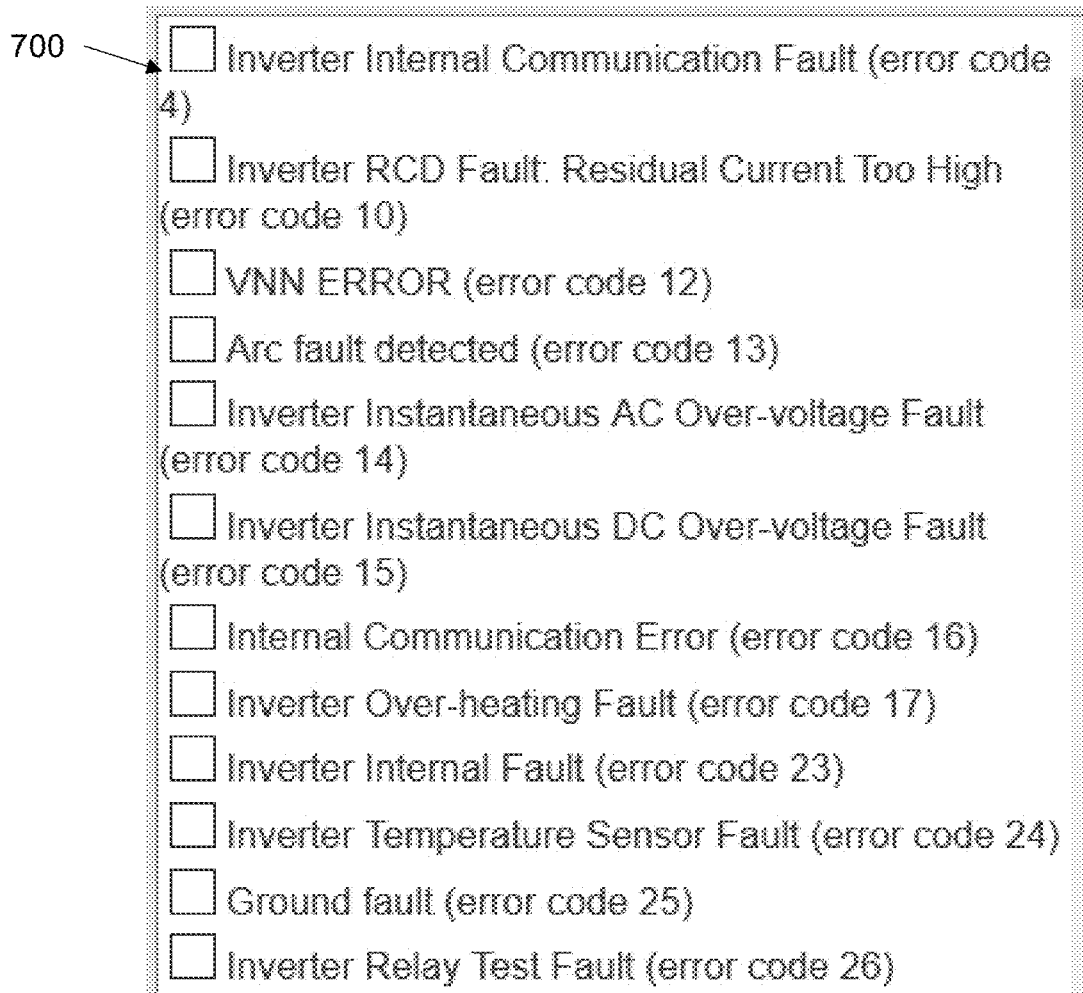
FIG. 7A shows a first example screenshot of fault types in a PV system fault presentation.

Reference is now made to FIG. 5, which shows an example screenshot 500 of component details in a PV system fault presentation. For example, the pop up menu shows more actions for the component fault, such as changing layout, exclude this component, view alert history, and/or the like.

Reference is now made to FIG. 6, which shows an example screenshot 600 of rules in a PV system fault presentation. For example, an alternative user interface (UI) shows how to configure the faults of a component, such as a group of types of faults. As shown in FIG. 6, rules for selection may include: no data from site, no data from inverter, power optimizer shutdown, meter communication fault, inverter in standby mode, and/or the like.

Reference is now made to FIG. 7A thru FIG. 7D, which respectively show first, second, third and fourth example screenshots 700, 710, 720, and 730 of fault types in a PV system fault presentation. For example, specific faults of a group may be selected for mapping, configuration of rules, and/or the like.

Figure 8:
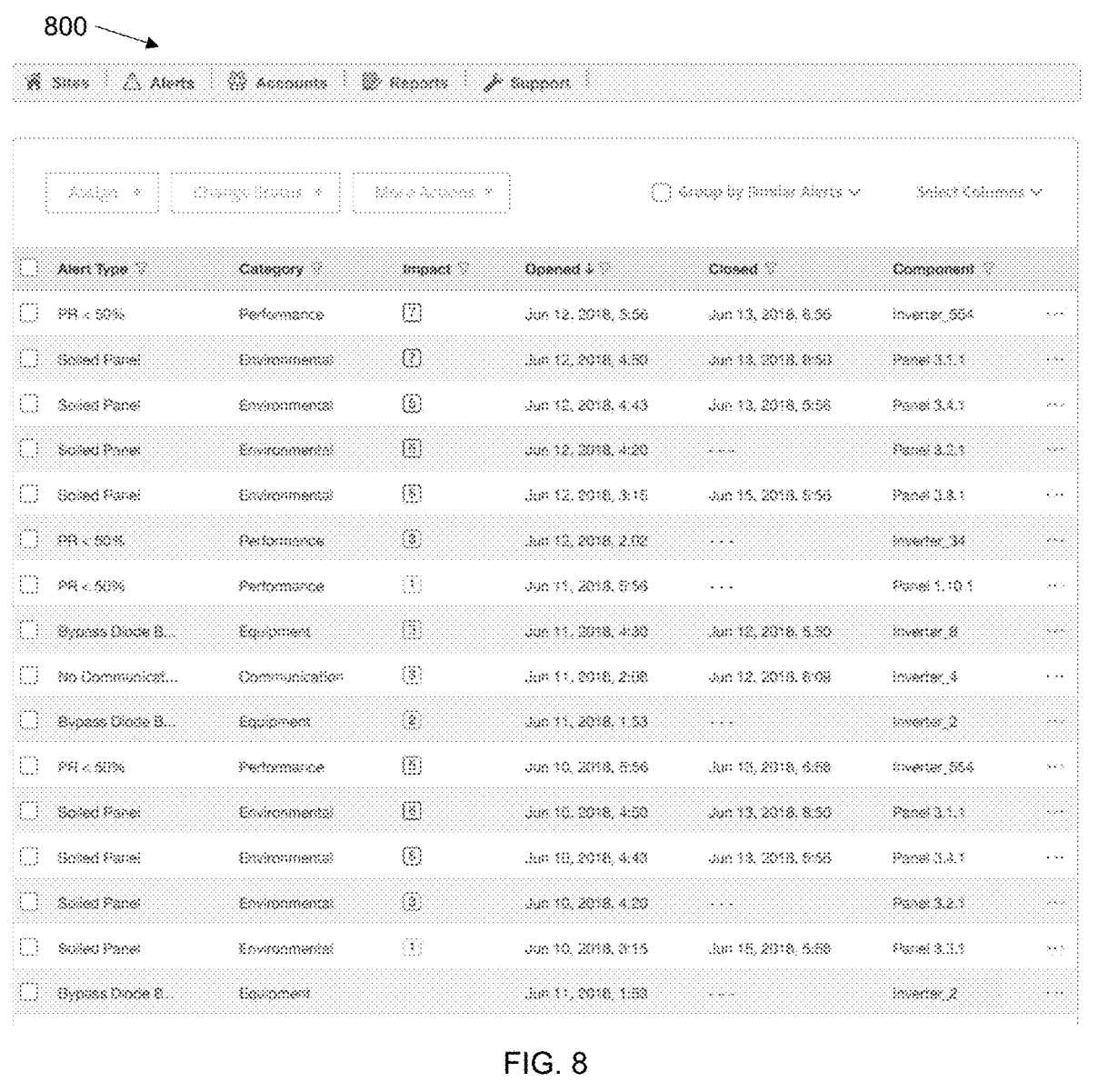

Reference is now made to FIG. 8, which shows an example screenshot 800 of alerts in a PV system fault presentation. The alerts may be listed by type, category, impart value, timestamp opened, timestamp closed, component involved, and of the like. Each column may be used to sort or filter the alerts presented on the user display.

Figure 9:
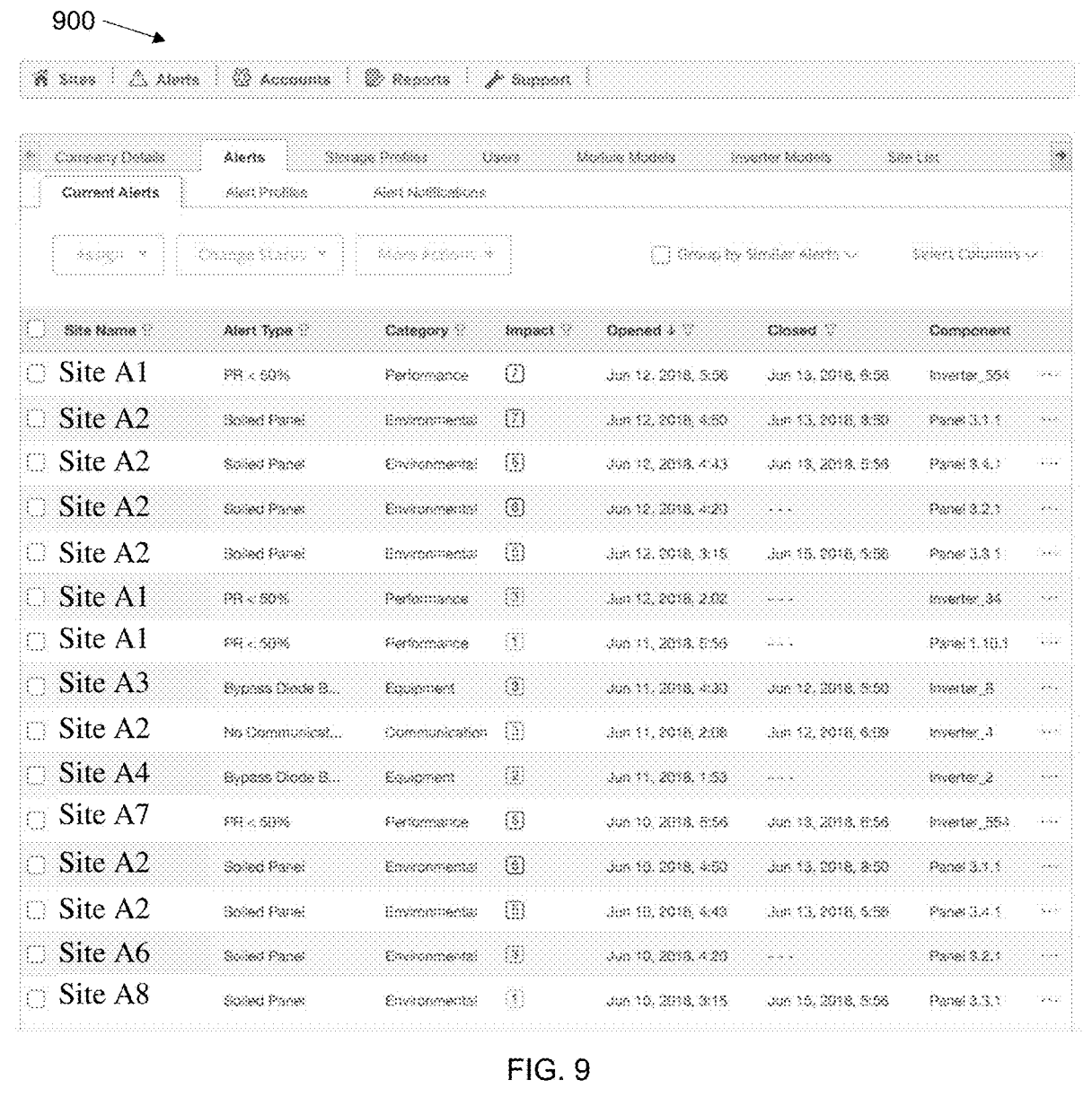

Reference is now made to FIG. 9, which shows an example screenshot 900 of accounts in a PV system fault presentation. An accounts tab may be selected on the user display, to organize the alerts from multiple sites according to the account and/or site the alert has originated from. Each column may be used to sort or filter the alerts presented on the user display.

Figure 10:
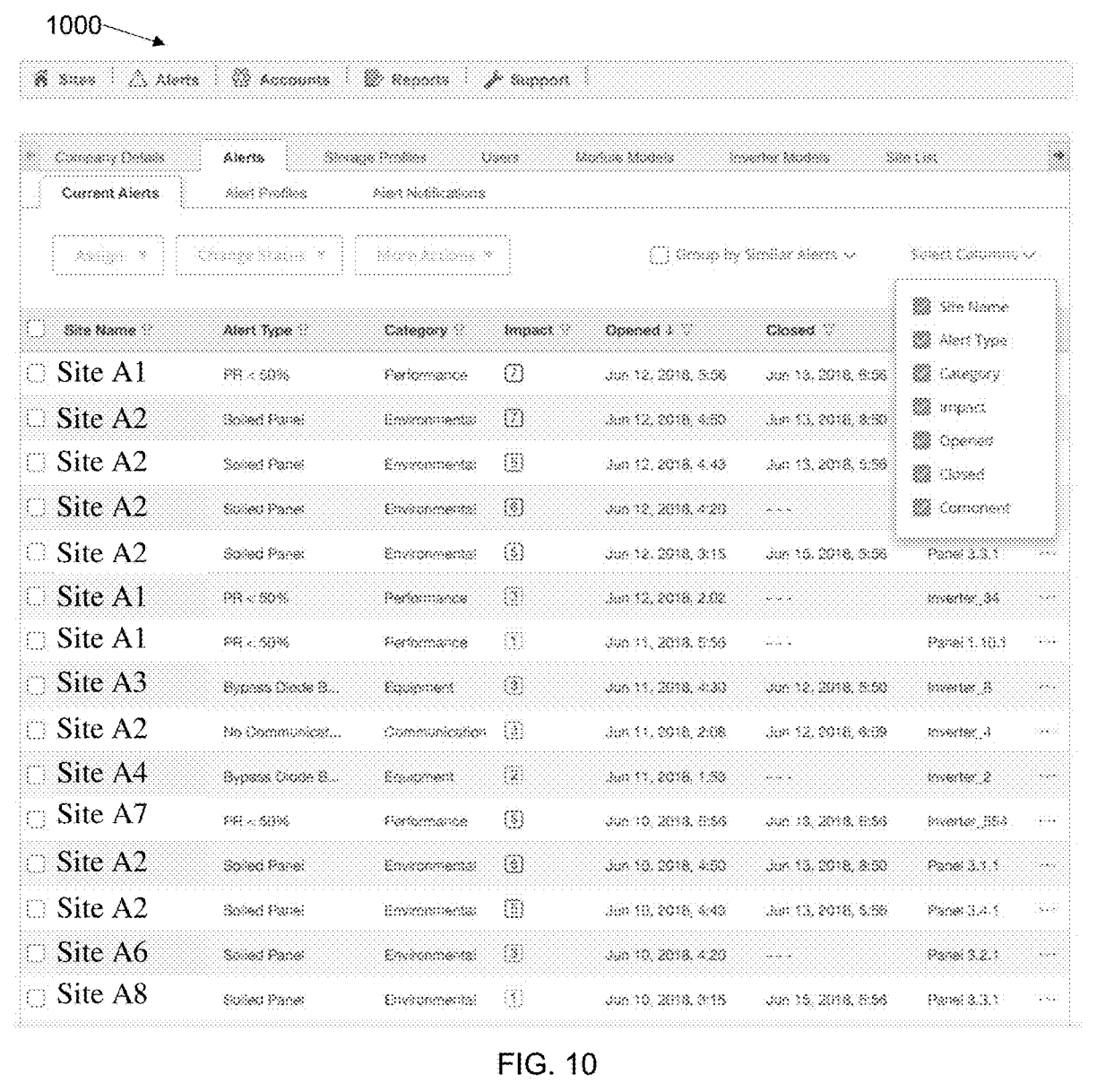

Reference is now made to FIG. 10, which shows an example screenshot 1000 of account column selection in a PV system fault presentation. Columns may be selected for presentation on a display of the user interface.

Figure 11:
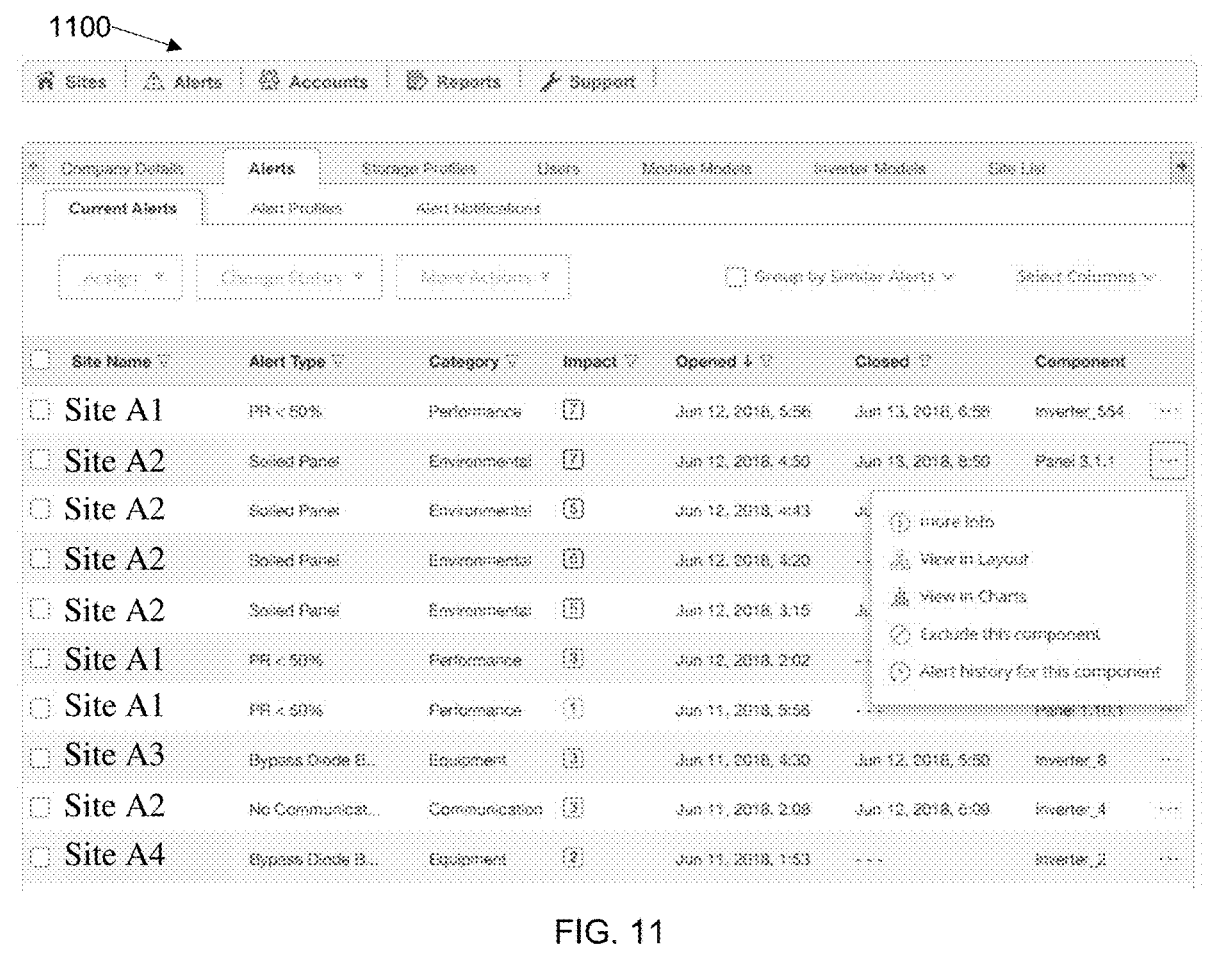

Reference is now made to FIG. 11, which shows an example screenshot 1100 of account details in a PV system fault presentation. For example, the account details may be selected for an alert, and a popup menu may show options for a user selection to modify the alert display, such as view options and/or the like.

Figure 12:
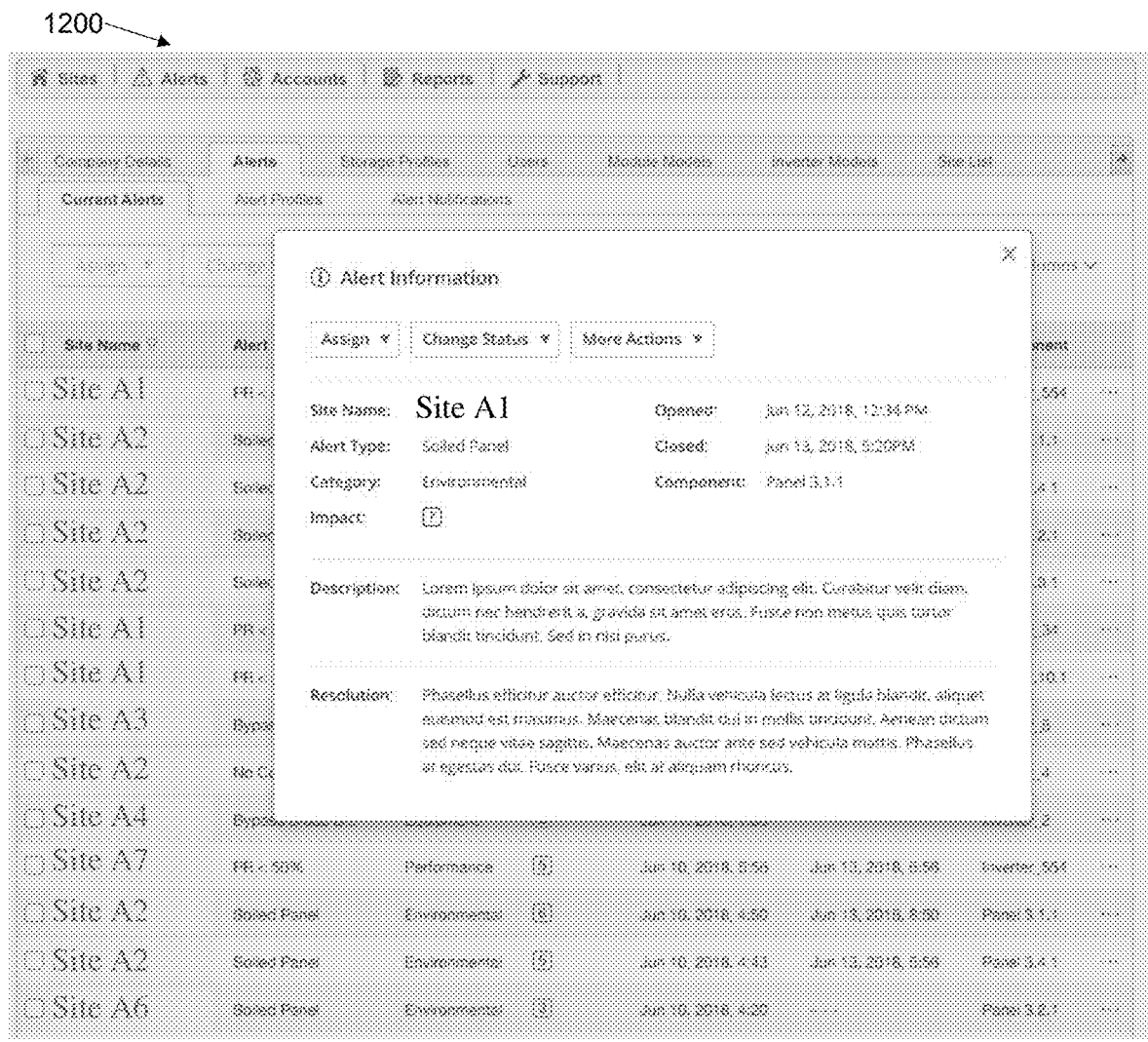
FIG. 12 shows an example screenshot of alert information in a PV system fault presentation.

Reference is now made to FIG. 12, which shows an example screenshot 1200 of alert information in a PV system fault presentation. For example, the alert information may show the category of alert, type of alert, specific components, and/or the like. In particular, FIG. 12 shows a pop-up window with illustrative alert information in an example foreign language including detailed description of the alert, and resolution information regarding the alert.

Figure 13:
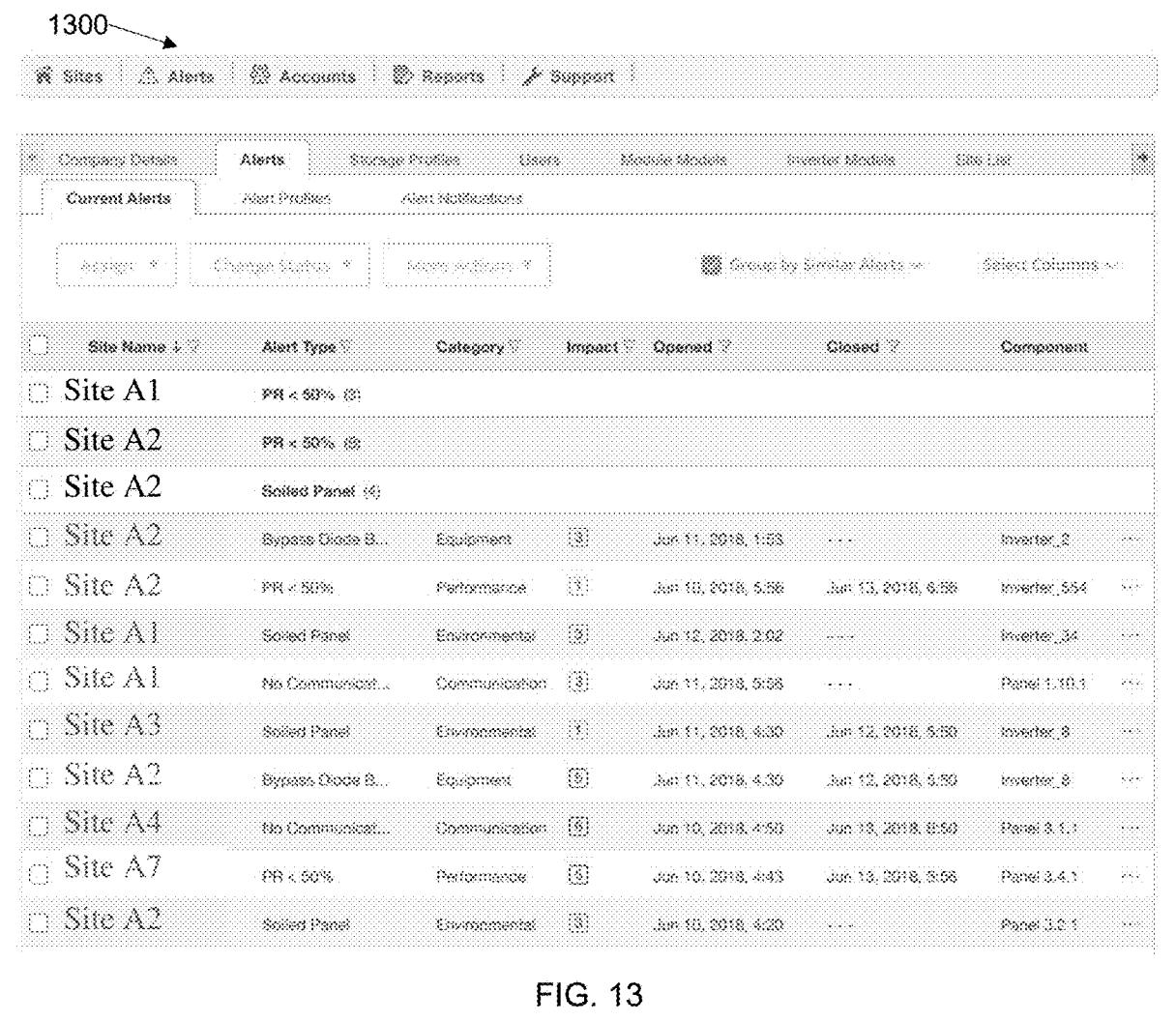

Reference is now made to FIG. 13, which shows an example screenshot 1300 of alert groups categories in a PV system fault presentation. For example, on an accounts page a user selection of the "group by similar alerts" may group the alerts by account name.

Figure 14:
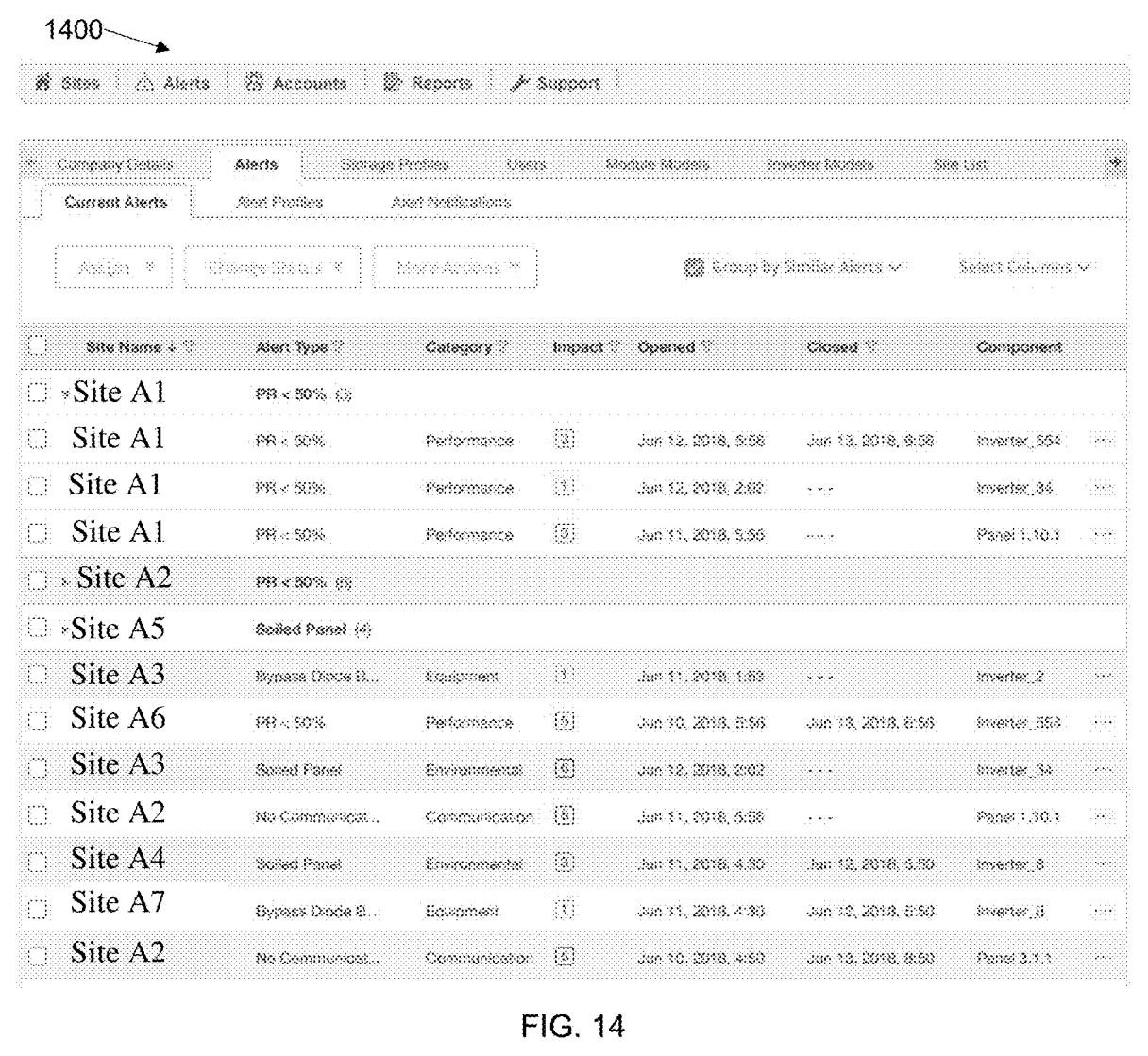

Reference is now made to FIG. 14, which shows an example screenshot 1400 of individual alerts in a PV system fault presentation. For example, a user selection of a grouped account name may show a list of alerts for that account.

Figure 15:
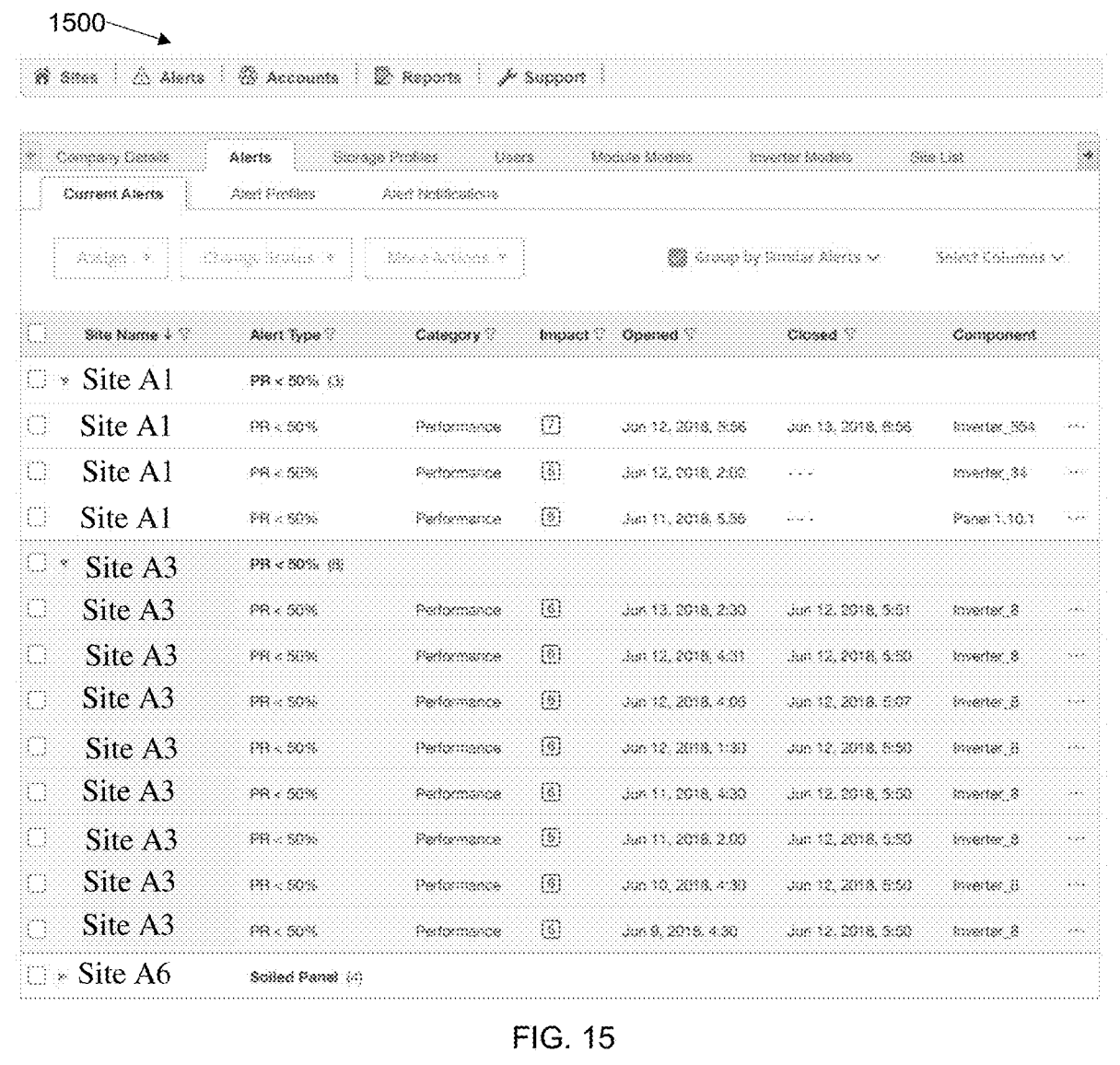

Reference is now made to FIG. 15, which shows an example screenshot 1500 of second individual alerts in a PV system fault presentation. For example, a user selection of a second grouped account name may show a second list of alerts for a second account.

Figure 16:
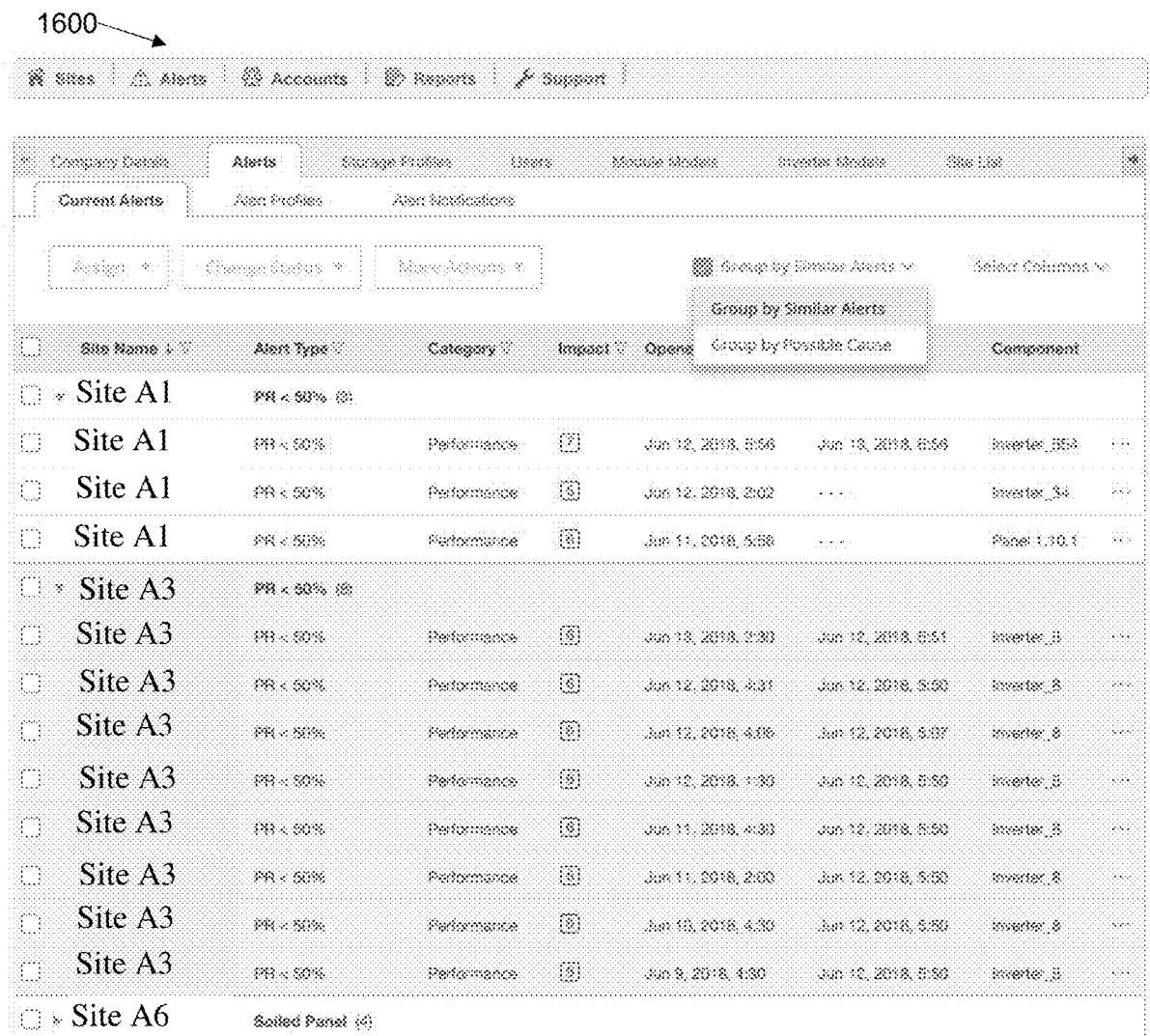
FIG. 16 shows an example screenshot of alert grouping selection in a PV system fault presentation.

Reference is now made to FIG. 16, which shows an example screenshot 1600 of alert grouping selection in a PV system fault presentation. For example, alerts may be grouped by similar alerts or possible causes, such as showing a hierarchy of alerts.

Figure 17:
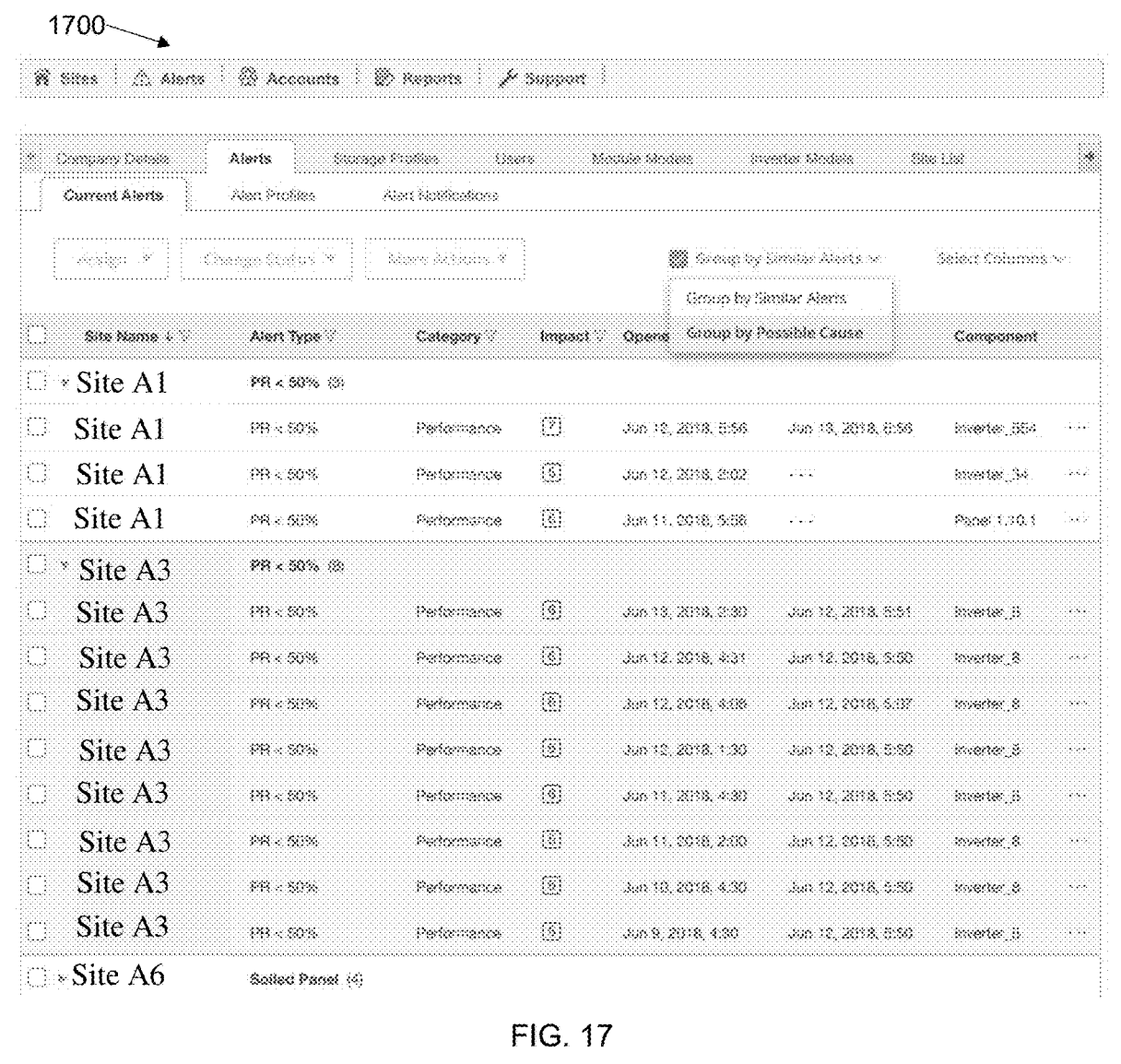

Reference is now made to FIG. 17, which shows an example screenshot 1700 of alert by cause grouping in a PV system fault presentation. For example, a user selection of "group by possible cause" may group the alerts that are caused by a single cause (parent fault or root-cause fault) together.

Figure 18:
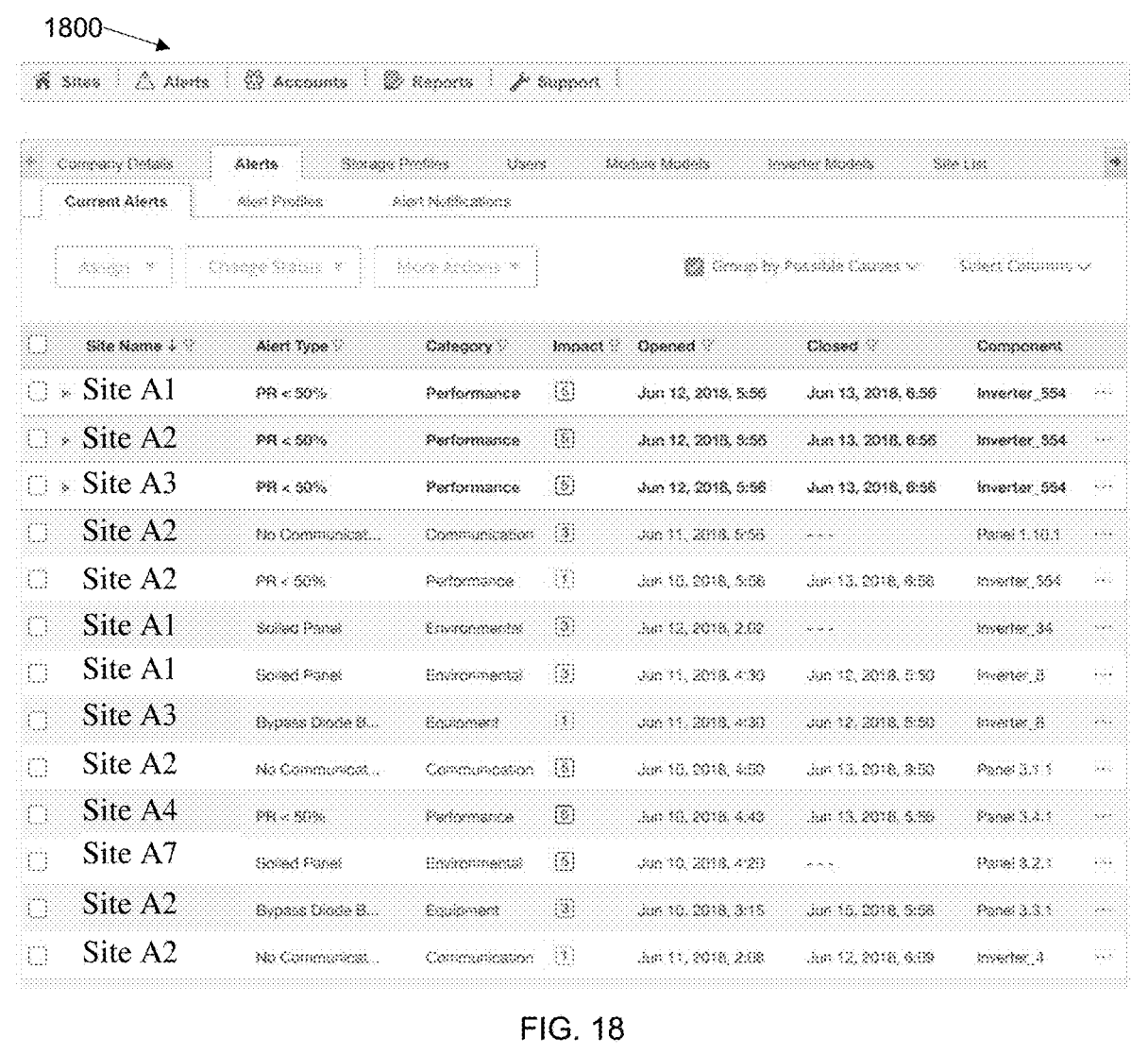

Reference is now made to FIG. 18, which shows an example screenshot 1800 of alert by cause groups in a PV system fault presentation. For example, screenshot 1800 shows the root cause alerts for several account names.

Figures 19, 20:
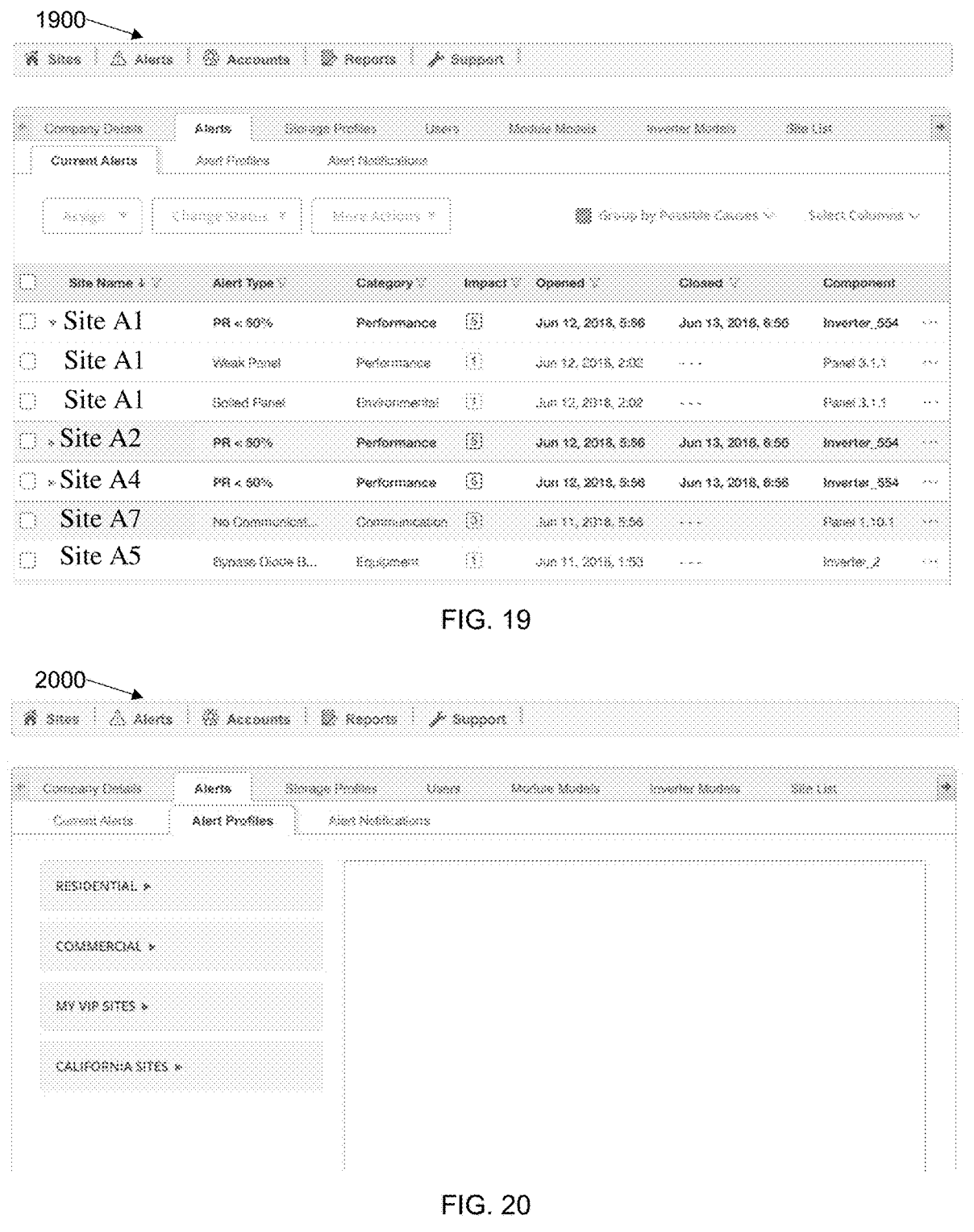

Reference is now made to FIG. 19, which shows an example screenshot 1900 of alert group details in a PV system fault presentation. For example, a user selection of an account name opens alerts that are dependent on the root cause alert.

Reference is now made to FIG. 20, which shows an example screenshot 2000 of alert profiles in a PV system fault presentation. For example, a user selection of an alert profiles tab opens a selection of profiles for different types of installations, such as residential, commercial, VIP sites, sites at a particular region (e.g., California, bay-area, LA area).

Figure 21:
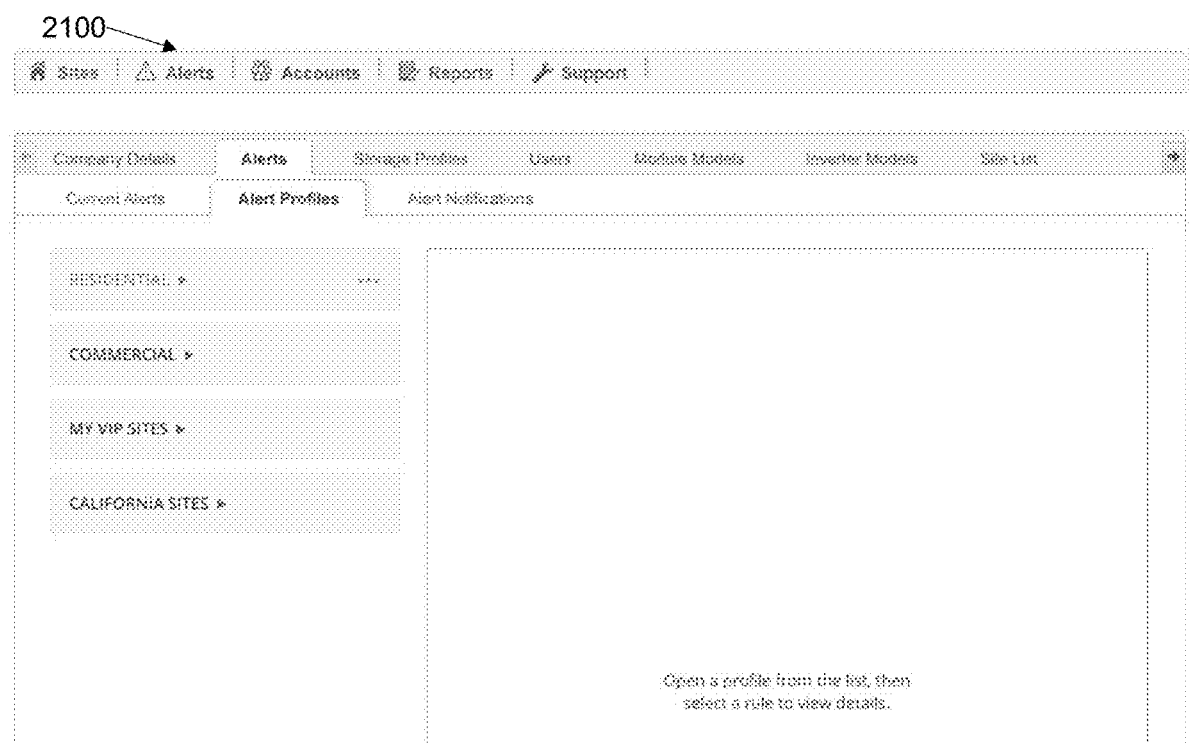
FIG. 21 shows an example screenshot of residential account alert profiles in a PV system fault presentation.

Reference is now made to FIG. 21, which shows an example screenshot 2100 of residential account alert profiles in a PV system fault presentation. For example, a user selection of a profiles for a type of installation shows the profiles for that installation, such as a residential profile installation, by clicking on " . . . ".

Figure 22:
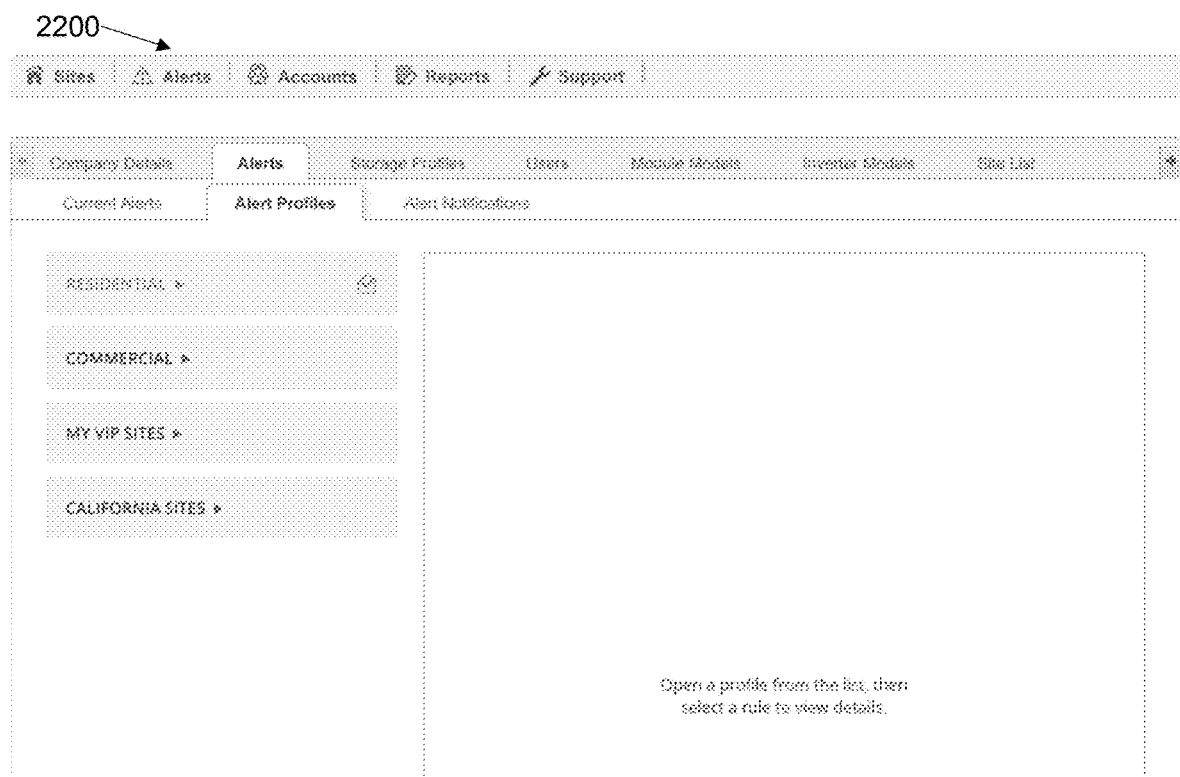
FIG. 22 shows an example screenshot of residential account alert profile selection in a PV system fault presentation.

Reference is now made to FIG. 22, which shows an example screenshot 2200 of residential account alert profile selection in a PV system fault presentation. For example, after a user clicks on the indication of residential profiles on the screen in FIG. 21, such as " . . . ", the screen of FIG. 22 may indicate the user selection by showing an icon with a check mark next to the residential profile selection.

Figure 23:
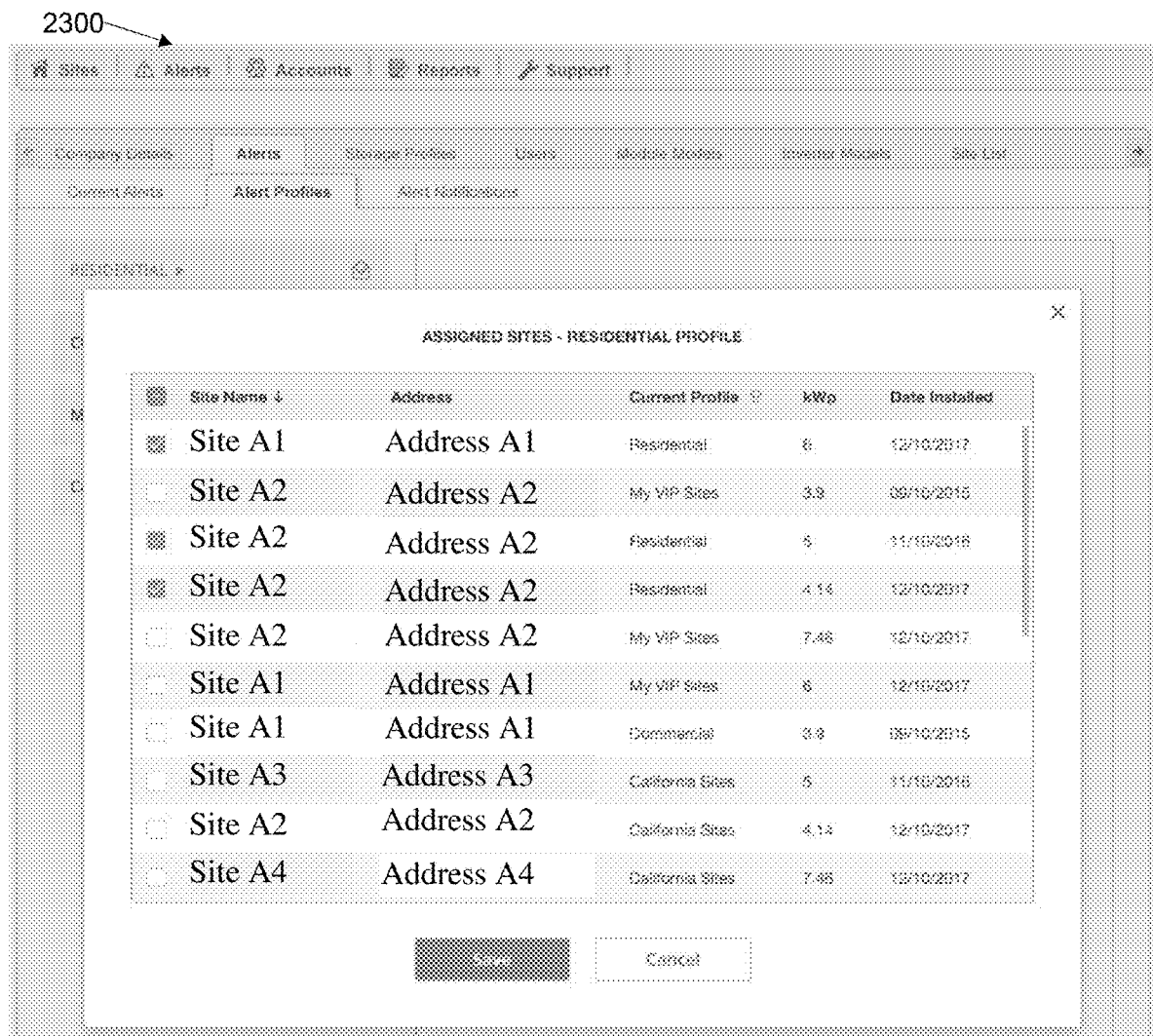
FIG. 23 shows an example screenshot of residential account alert profile details in a PV system fault presentation.

Reference is now made to FIG. 23, which shows an example screenshot 2300 of residential account alert profile details in a PV system fault presentation. For example, a user selection of a list of installations with this profile shows the installations with that profile.

Figure 24:
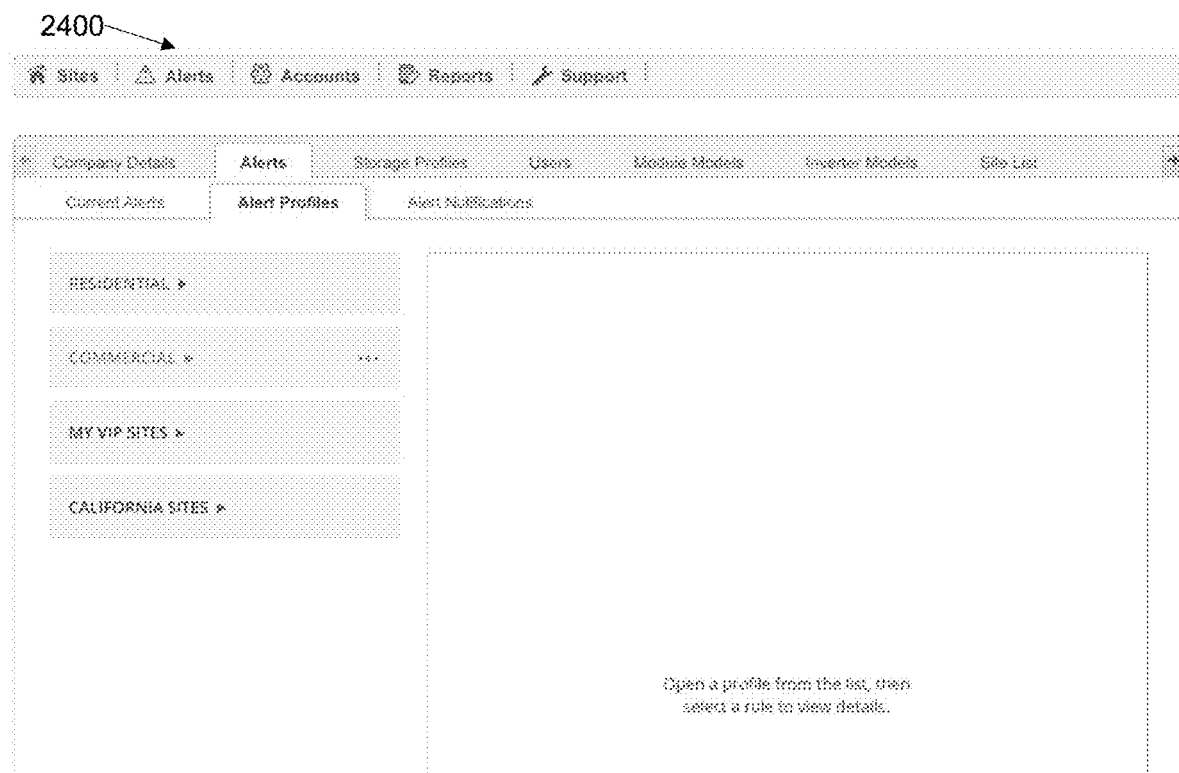
FIG. 24 shows an example screenshot of commercial account profiles in a PV system fault presentation.

Reference is now made to FIG. 24, which shows an example screenshot 2400 of commercial account profiles in a PV system fault presentation. For example, a user selection of a profiles for a type of installation shows the profiles for that installation, such as a commercial profile installation.

Figure 25:
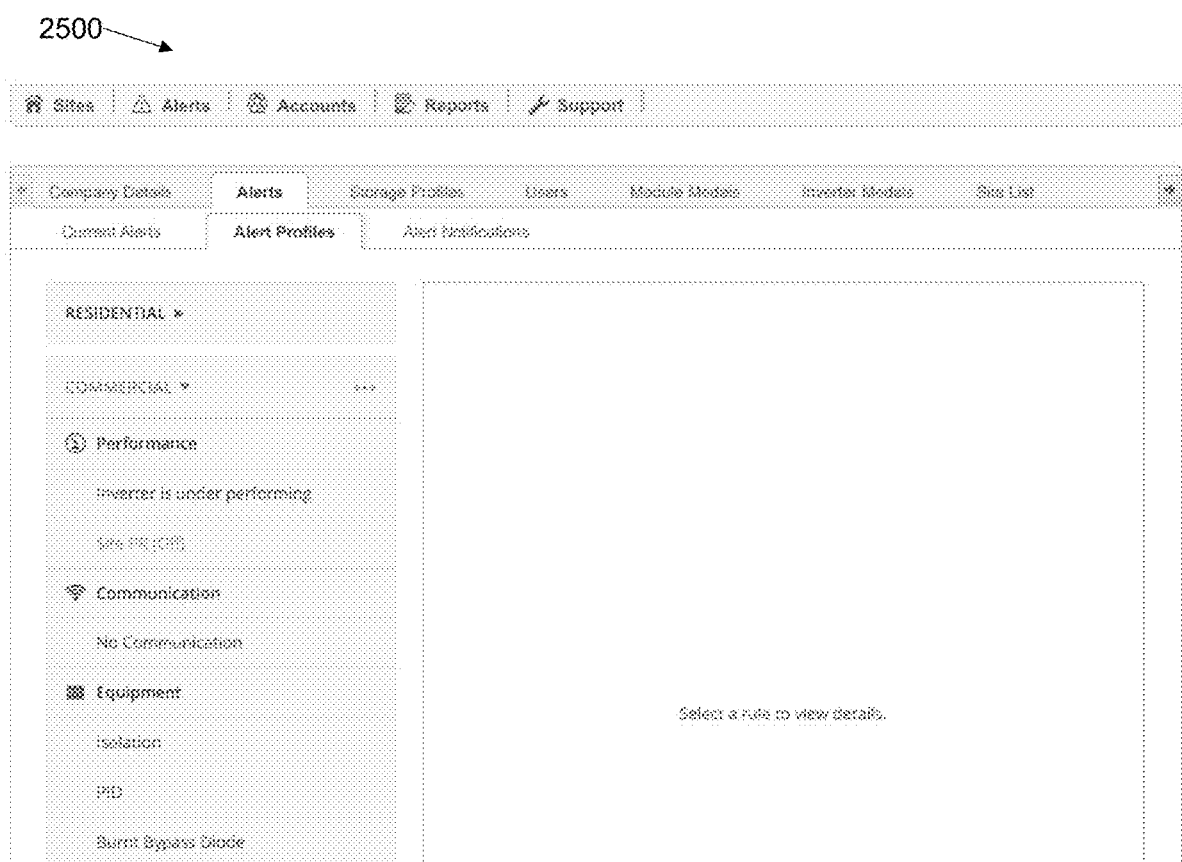
FIG. 25 shows an example screenshot of commercial account profile alerts in a PV system fault presentation.

Reference is now made to FIG. 25, which shows an example screenshot 2500 of commercial account profile alerts in a PV system fault presentation. For example, a user selection of a profiles for a type of installation shows the alert profiles for that installation, such as an alert for "inverter is underperforming" in a commercial profile installation.

Figure 26:
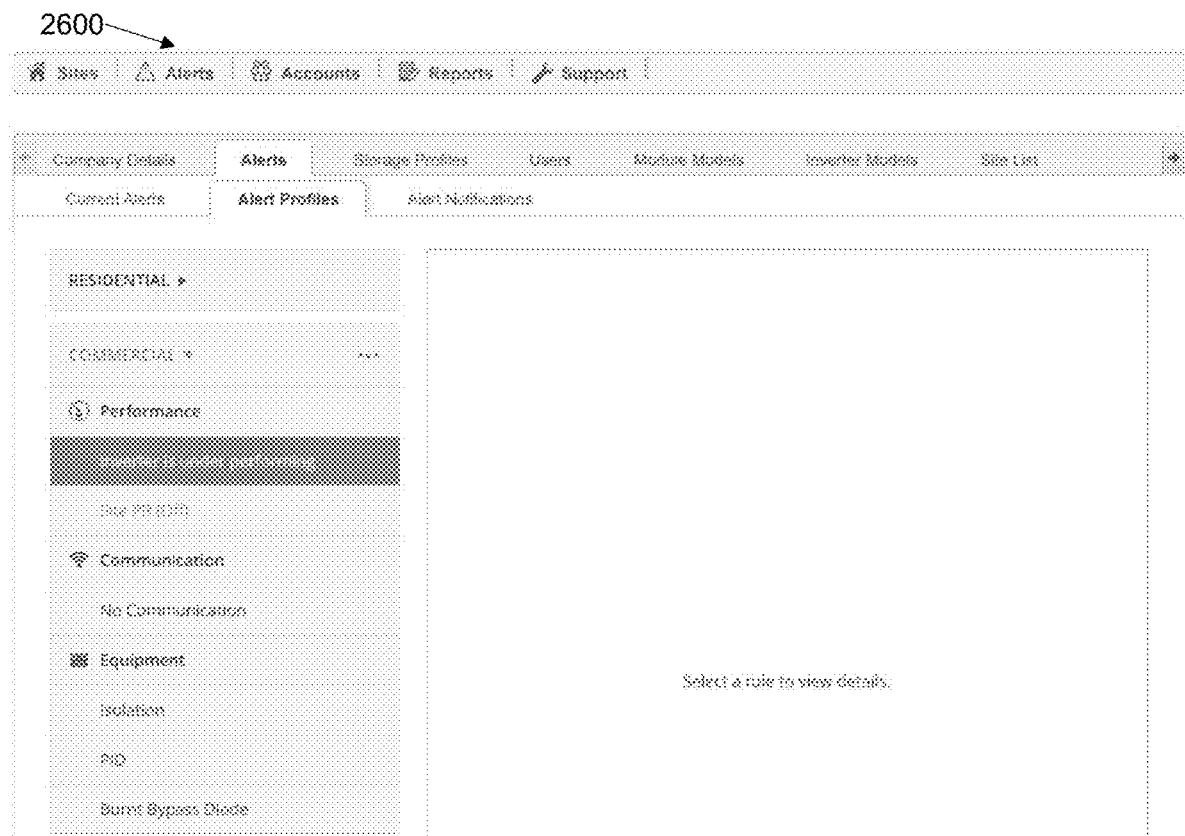
FIG. 26 shows an example screenshot of commercial account profile alert selection in a PV system fault presentation.

Reference is now made to FIG. 26, which shows an example screenshot 2600 of commercial account profile alert selection in a PV system fault presentation. In FIG. 26, the user has selected the "inverter is under performing" alert.

Figure 27:
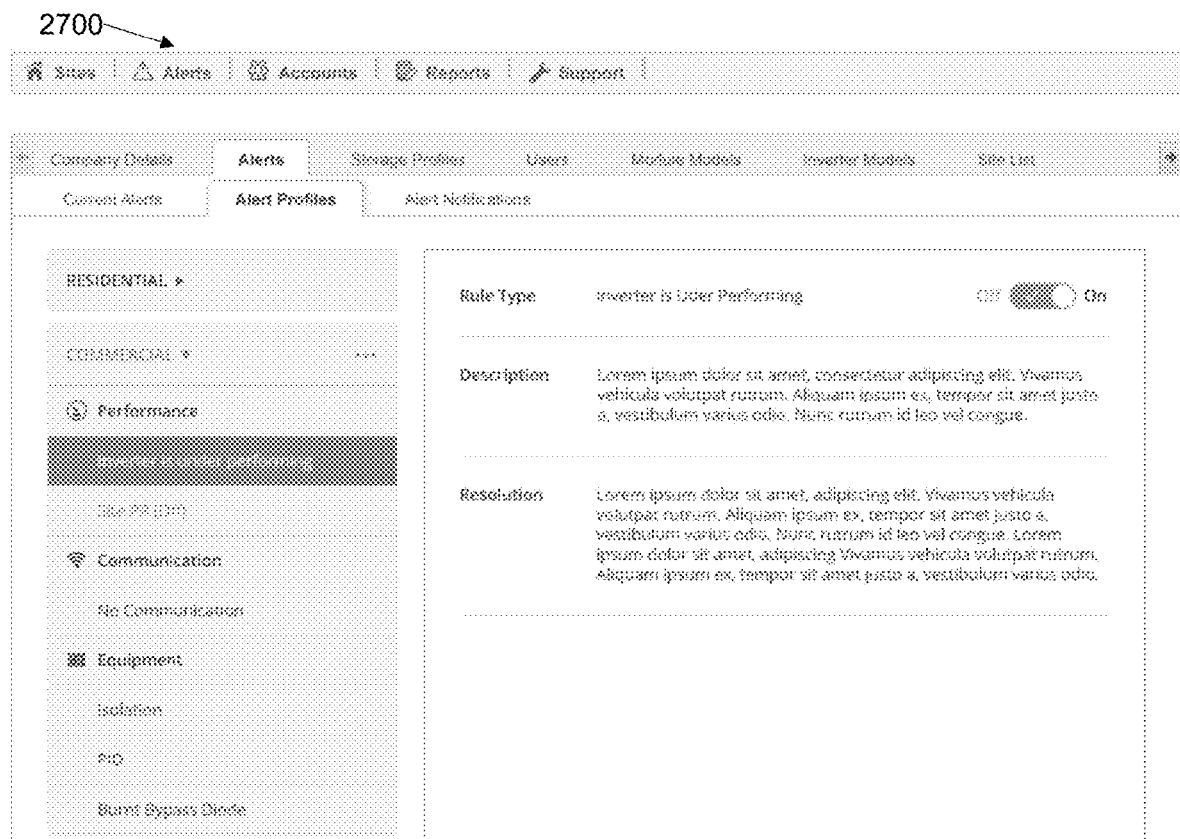
FIG. 27 shows an example screenshot of commercial account profile alert rule details in a PV system fault presentation.

Reference is now made to FIG. 27, which shows an example screenshot 2700 of commercial account profile alert rule details in a PV system fault presentation. For example, a user selection of an alert for "inverter is underperforming" in a commercial profile installation in FIG. 26 may show the rules for that alert in FIG. 27. The example non-English language text is used for illustration purposes only and should not be indicative of a limitation of the disclosure.

Figure 28:
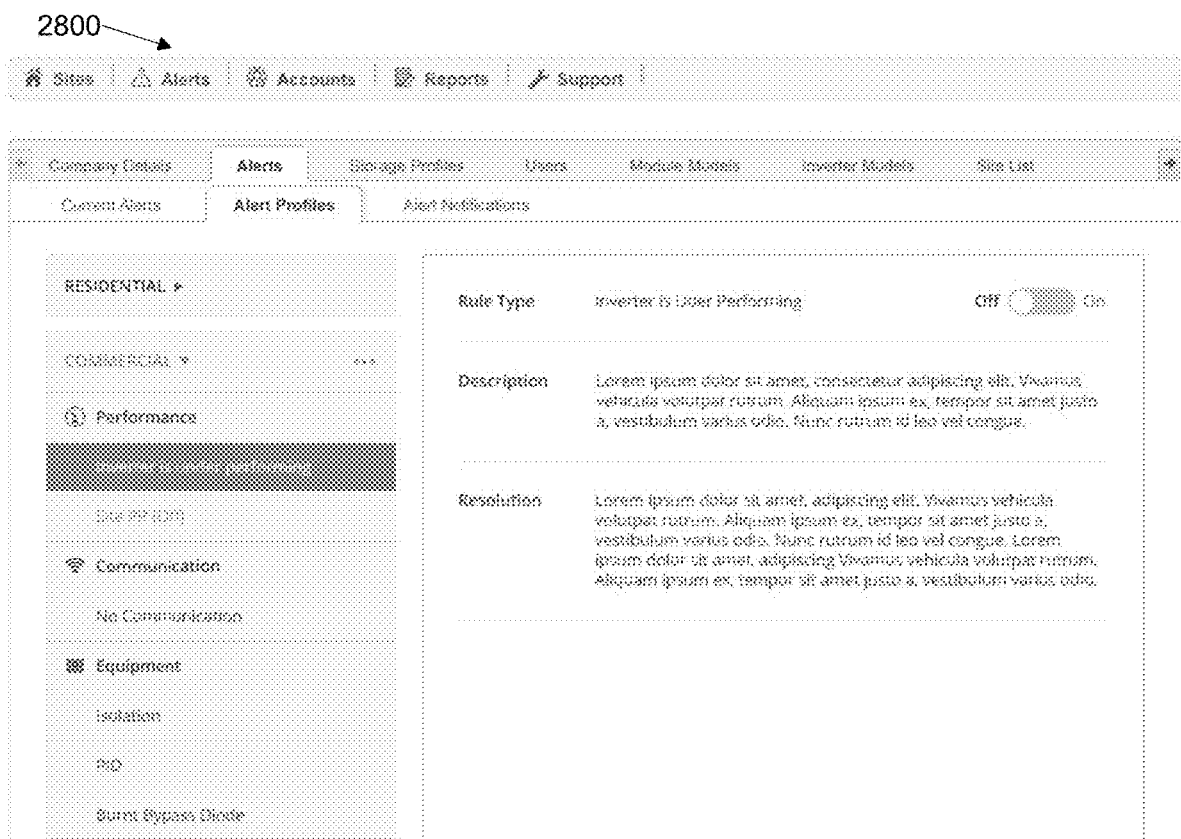
FIG. 28 shows an example screenshot of commercial account profile alert rule disabling in a PV system fault presentation.

Reference is now made to FIG. 28, which shows an example screenshot 2800 of commercial account profile alert rule disabling in a PV system fault presentation. For example, a user selection may be entered to turn off a rule for an alert of "inverter is underperforming" in a commercial profile installation. An On/Off slide button is provided to enable a user to turn particular rule on or off, whereby FIG. 27 shows the rule turned On whereas FIG. 28 shows that rule turned Off. The example non-English language text is used for illustration purposes only and should not be indicative of a limitation of the disclosure.

Here as elsewhere in the specification and claims, ranges or lists can be combined to form new and non-disclosed ranges.

Specific dimensions, specific materials, and/or specific shapes disclosed herein are example in nature and do not limit the scope of the present disclosure. The disclosure herein of particular values and particular ranges of values for given parameters are not exclusive of other values and ranges of values that may be useful in one or more of the examples disclosed herein. Moreover, it is envisioned that any two particular values for a specific parameter stated herein may define the endpoints of a range of values that may be suitable for the given parameter (such as, the disclosure of a first value and a second value for a given parameter can be interpreted as disclosing that any value between the first and second values could also be employed for the given parameter). For example, if Parameter X is exemplified herein to have value A and also exemplified to have value Z, it is envisioned that parameter X may have a range of values from about A to about Z. Similarly, it is envisioned that disclosure of two or more ranges of values for a parameter (whether such ranges are nested, overlapping or distinct) subsume all possible combination of ranges for the value that might be claimed using endpoints of the disclosed ranges. For example, if parameter X is exemplified herein to have values in the range of 1-10, or 2-9, or 3-8, it is also envisioned that Parameter X may have other ranges of values including 1-9, 1-8, 1-3, 1-2, 2-10, 2-8, 2-3, 3-10, and 3-9.

An example embodiment may be a system, a method, and/or a computer program product at any possible technical detail level of integration. The computer program product may include a computer readable storage medium (or media) having computer readable program instructions thereon for causing a hardware processor to carry out aspects disclosed herein.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (such as, light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to example embodiments. It may be understood that each block of the flowchart illustrations and/or block diagrams, and combinations of blocks in the flowchart illustrations and/or block diagrams, can be implemented by computer readable program instructions.

These computer readable program instructions may be provided to a hardware processor of a general purpose computer, special purpose computer, or other programmable data processing apparatus to produce a machine, such that the instructions, which execute via the hardware processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It may also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In the description of various illustrative features, reference is made to the accompanying drawings, which form a part hereof, and in which is shown, by way of illustration, various features in which aspects of the disclosure may be practiced. It is to be understood that other features may be utilized and structural and functional modifications may be made, without departing from the scope of the present disclosure.

The term "multiple" as used here in the detailed description indicates the property of having or involving several parts, elements, or members. The claim term "a plurality of" as used herein in the claims section finds support in the description with use of the term "multiple" and/or other plural forms. Other plural forms may include for example regular nouns that form their plurals by adding either the letter 's' or 'es' so that the plural of converter is converters or the plural of switch is switches for example.

It may be noted that various connections are set forth between elements herein. These connections are described in general and, unless specified otherwise, may be direct or indirect; this specification may be not intended to be limiting in this respect. Further, elements of one feature may be combined with elements from other features in appropriate combinations or sub-combinations.

All optional and preferred features and modifications of the described features and dependent claims are usable in all aspects taught herein. Furthermore, the individual features of the dependent claims, as well as all optional and preferred features and modifications of the described features are combinable and interchangeable with one another.

The invention claimed is:

1. A method comprising:
receiving, by one or more processors and from at least one power device of a power generation system, a fault identification associated with the at least one power device of the power generation system, wherein the fault identification comprises a fault type and a temporal value;
retrieving, by the one or more processors and from storage memory, a rule associated with the fault identification, the rule comprising a fault type term and a temporal term, wherein the fault type term corresponds to the fault type, and wherein the temporal term corresponds to the temporal value;
determining, by the one or more processors and based on the rule and the fault identification, a severity level associated with the fault identification; and

29 activating an alert on a user interface connected to the one or more processors, wherein the alert corresponds to the severity level.

2. The method of claim 1, wherein the determining the severity level comprises determining the severity level further based on at least one of:
   an impact value that is determined, by the one or more processors, based on the rule;
   a specification of the power generation system, wherein the specification is retrieved by the one or more processors from the storage memory; or
   information about an environment of the power generation system, wherein the information about the environment is retrieved by the one or more processors from a database.

3. The method of claim 2, wherein the specification of the power generation system comprises at least one of:
   an installation parameter of the power generation system, or
   a quantity of solar panels in the power generation system.

4. The method of claim 2, wherein the environment of the power generation system comprises at least one of a cultural consideration or a linguistic consideration.

5. The method of claim 2, wherein the environment of the power generation system comprises at least one of:
   a geographical region within which the power generation system is located,
   a weather in the geographical region, or
   a maintenance history of the power generation system.

6. The method of claim 1, wherein the fault identification comprises at least one electrical parameter value.

7. The method of claim 6, wherein the at least one electrical parameter value comprises at least one of a voltage value, a current value, or a power value.

8. The method of claim 1, wherein the rule comprises a formula:

$$L=e(\text{power},\text{voltage},\text{current})\cdot t(\text{temporal value}),$$

wherein e(power, voltage, current) takes as input at least one of power, voltage, or current, each of which is associated with the fault identification, and
wherein t(temporal value) takes as input the temporal value, wherein the temporal value indicates when a fault associated with the fault identification was active or will be active at a future time.

9. The method of claim 1, wherein the rule comprises a formula:

$$L = (\alpha \cdot \# p + C)\cdot \max_{days}\left(\frac{\text{fault time during each day}}{12 \text{ hours}}\right),$$

wherein $\alpha$ and C denote coefficients based on the fault identification, wherein #p denotes a number of solar panels affected, wherein ($\alpha\cdot$ #p+C) denotes a power loss term, and wherein $$\max_{days}\left(\frac{\text{fault time during each day}}{12 \text{ hours}}\right)$$

denotes the temporal term, which is based on the fault identification.

10. The method of claim 9, wherein the rule further comprises a root cause term, wherein the root cause term is based on one or more root cause impact values, and wherein the one or more root cause impact values are calculated iteratively using the formula.

11. The method of claim 1, wherein the rule further comprises a root cause term, wherein the root cause term is based on one or more root cause impact values, wherein each value of the one or more root cause impact values is determined based on a root cause fault identification, wherein the root cause fault identification is determined based on a mapping and the fault identification, and wherein the root cause fault identification comprises a second fault type and a second temporal value.

12. A device comprising:
   at least one hardware processor; and
   storage memory storing instructions that, when executed by the at least one hardware processor, cause the at least one hardware processor to:
      receive, from at least one power device of a power generation system, a fault identification associated with the power generation system, wherein the fault identification comprises a fault type and a temporal value;
      retrieve, from another storage memory connected to the at least one power device, a rule associated with the fault identification, the rule comprising a fault type term and a temporal term, wherein the fault type term corresponds to the fault type and the temporal term corresponds to the temporal value;
      determine, based on the rule and the fault identification, a severity level associated with the fault identification; and
      activating an alert on a user interface connected to the at least one hardware processor, wherein the alert corresponds to the severity level.

13. The device of claim 12, wherein the instructions, when executed by the at least one hardware processor, cause the device to determine the severity level by determining the severity level further based on at least one of:
   an impact value that is determined based on the rule,
   a specification of the power generation system, or
   an environment of the power generation system.

14. The device of claim 13, wherein the specification of the power generation system comprises at least one of:
   an installation parameter of the power generation system, or
   a quantity of solar panels in the power generation system.

15. The device of claim 13, wherein the environment of the power generation system comprises at least one of:
   a geographical region within which the power generation system is located,
   a weather in the geographical region, or
   a maintenance history of the power generation system.

16. The device of claim 12, wherein the fault identification comprises at least one electrical parameter value.

17. The device of claim 16, wherein the at least one electrical parameter value comprise at least one of a voltage value, a current value, or a power value.

18. The device of claim 12, wherein the rule comprises a formula:

$$L=e(\text{power},\text{voltage},\text{current})\cdot t(\text{temporal value}),$$

wherein e(power, voltage, current) takes as input at least one of power, voltage, or current, each of which is associated with the fault identification, and
wherein t(temporal value) takes as input the temporal value, wherein the temporal value indicates when a fault associated with the fault identification was active or is computed to be active in a future.

19. The device of claim 12, wherein the rule comprises a formula:

$$L = (\alpha \cdot \# p + C) \cdot \max_{days}\left(\frac{\text{fault time during each day}}{12 \text{ hours}}\right)$$

wherein $\alpha$ and C denote coefficients based on the fault identification, wherein #p denotes a number of solar panels affected, wherein ($\alpha \cdot$ #p+C) denotes a power loss term, and wherein $$\max_{days}\left(\frac{\text{fault time during each day}}{12 \text{ hours}}\right)$$

denotes the temporal term, which is based on the fault identification.

20. The device of claim 12, wherein the rule further comprises a root cause term, wherein the root cause term is based on one or more root cause impact values, wherein each value of the one or more root cause impact values is determined based on a root cause fault identification, and wherein the root cause fault identification is determined based on a mapping and the fault identification.

* * * * *